United States Patent
Shwartz et al.

(10) Patent No.: US 12,278,085 B2
(45) Date of Patent: Apr. 15, 2025

(54) HYBRID SCANNING ELECTRON MICROSCOPY AND ACOUSTO-OPTIC BASED METROLOGY

(71) Applicant: APPLIED MATERIALS ISRAEL LTD., Rehovot (IL)

(72) Inventors: Guy Shwartz, Ramat-Gan (IL); Ori Golani, Ramat Gan (IL); Itamar Shani, Rehovot (IL); Ido Almog, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 590 days.

(21) Appl. No.: 17/714,908

(22) Filed: Apr. 6, 2022

(65) Prior Publication Data
US 2023/0326713 A1    Oct. 12, 2023

(51) Int. Cl.
  H01J 37/28      (2006.01)
  G01N 23/2251    (2018.01)
  H01J 37/22      (2006.01)
  H01J 37/244     (2006.01)

(52) U.S. Cl.
  CPC .......... *H01J 37/28* (2013.01); *G01N 23/2251* (2013.01); *H01J 37/222* (2013.01); *H01J 37/244* (2013.01); *H01J 2237/226* (2013.01); *H01J 2237/24475* (2013.01); *H01J 2237/2448* (2013.01)

(58) Field of Classification Search
  CPC ........ H01J 37/28; H01J 37/222; H01J 37/244; H01J 2237/226; H01J 2237/24475; H01J 2237/2448; G01N 23/2251
  See application file for complete search history.

(56) References Cited

U.S. PATENT DOCUMENTS

| 6,002,480 A | 12/1999 | Izatt et al. |
| 7,050,178 B2 | 5/2006 | Morath et al. |
| 7,528,940 B2 | 5/2009 | Veis et al. |

(Continued)

FOREIGN PATENT DOCUMENTS

WO    2020247473 A1    12/2020

OTHER PUBLICATIONS

Matsuda, et al., "Coherent shear phonon generation and detection with picosecond laser acoustics", Phys. Rev. B 77, 224110, Jun. 20, 2008, pp. 1-18.

(Continued)

*Primary Examiner* — Sean M Luck
(74) *Attorney, Agent, or Firm* — Kilpatrick Townsend & Stockton LLP

(57) ABSTRACT

Disclosed herein is a method for non-destructive hybrid acousto-optic and scanning electron microscopy-based metrology. The method includes: (i) obtaining acousto-optic and scanning electron microscopy measurement data of an inspected structure on a sample; (ii) processing the measurement data to extract values of key measurement parameters corresponding to the acousto-optic measurement data and the scanning electron microscopy measurement data, respectively; and (iii) obtaining estimated values of one or more structural parameters of the inspected structure by inputting the extracted values into an algorithm, which is configured to jointly process the extracted values to output estimated values of the one or more structural parameters.

20 Claims, 10 Drawing Sheets

(56) References Cited

U.S. PATENT DOCUMENTS

| | | |
|---|---|---|
| 8,312,772 B2 | 11/2012 | Tas et al. |
| 9,050,178 B2 | 6/2015 | Barry et al. |
| 9,268,092 B1 | 2/2016 | Jarecki et al. |
| 9,576,862 B2 | 2/2017 | Murray et al. |
| 10,088,418 B2 | 10/2018 | Cheshnovsky et al. |
| 10,371,668 B2 | 8/2019 | Garnett et al. |
| 11,195,267 B1 | 12/2021 | Ilan et al. |
| 2015/0003834 A1 | 1/2015 | Shan et al. |
| 2016/0109736 A1 | 4/2016 | Bahl et al. |
| 2017/0254749 A1 | 9/2017 | Yun |
| 2019/0242820 A1 | 8/2019 | Audoin et al. |
| 2019/0335994 A1 | 11/2019 | Yun et al. |
| 2021/0098222 A1* | 4/2021 | Garcia Berrios ..... H01J 37/243 |
| 2021/0109453 A1 | 4/2021 | Pandev |
| 2022/0113129 A1 | 4/2022 | Golani et al. |
| 2023/0326713 A1 | 10/2023 | Shwartz et al. |

OTHER PUBLICATIONS

Matsuda, et al., "Fundamentals of picosecond laser ultrasonics", Ultrasonics, vol. 56, Feb. 2015, pp. 3-20.

Gusev, et al., "Advances in applications of time-domain Brillouin scattering for nanoscale imaging", Applied Physics Reviews, American Institute of Physics, 2 Huntington Quadrangle, Melville, NY, 11747, vol. 5, No. 3, Jul. 12, 2018, pp. 1-55.

\* cited by examiner

HYBRID SCANNING ELECTRON MICROSCOPY AND ACOUSTO-OPTIC BASED METROLOGY

TECHNICAL FIELD

The present disclosure relates generally to hybrid scanning electron microscopy and acousto-optic based metrology.

BACKGROUND OF THE INVENTION

With the shrinking of design rules, profiling of semiconductor specimens grows ever more complex as increasingly greater accuracy is required. State-of-the-art non-destructive techniques for metrology of semiconductor specimens primarily rely on scanning electron microscopy, optical critical dimension (OCD) scatterometry, and/or small angle X-ray scattering (SAXS). Each of these techniques has its own advantages and disadvantages. There remains an unmet need in the art for non-destructive techniques for metrology of semiconductor specimens, which afford greater accuracy.

BRIEF SUMMARY OF THE INVENTION

Aspects of the disclosure, according to some embodiments thereof, relate to non-destructive hybrid acousto-optic and scanning electron microscopy based metrology. More specifically, but not exclusively, aspects of the disclosure, according to some embodiments thereof, relate to methods and systems of non-destructive hybrid acousto-optic and scanning electron microscopy based metrology of semiconductor structures.

Thus, according to an aspect of some embodiments, there is provided a method for non-destructive hybrid acousto-optic and scanning electron microscopy-based metrology. The method includes:
  Obtaining acousto-optic and scanning electron microscopy measurement data of an inspected structure on a sample (e.g. a semiconductor device such as a wafer).
  Processing the measurement data to extract values of key measurement parameters corresponding to the acousto-optic measurement data and the scanning electron microscopy measurement data, respectively.
  Obtaining estimated values of one or more structural parameters of the inspected structure by inputting the extracted values into an algorithm, which is configured to jointly process the extracted values and thereby output estimated values of the one or more structural parameters.

According to some embodiments of the method, the algorithm is a ML-derived algorithm. According to some embodiments, the ML-derived algorithm is an artificial neural network (ANN) or a regression model. According to some embodiments, the ANN is a backward propagation neural network. According to some embodiments, the ANN is a forward propagation neural network.

According to some embodiments of the method, the algorithm is a search algorithm including an interpolator, which is configured to output interpolated values of the key measurement parameters when guesstimates of structural parameters are input thereinto. The search algorithm may be configured to, starting from initial guesstimates of the structural parameters, repeatedly modify the guesstimates, until interpolated values of the key measurement parameters, obtained from the guesstimates, match the extracted values of the key measurement parameters to a required precision (or, else, fail to converge).

According to some embodiments of the method, the interpolator is a ML-derived algorithm or is model-based (e.g. derived through computer simulations which model the inspected structure and the measurement setup used to obtain the measurement data). According to some embodiments, the interpolator is a forward propagation neural network.

According to some embodiments of the method, the inspected structure is exposed, and the acousto-optic measurement data is obtained by suboperations of:
  Projecting an optical pump beam ("pump beam" henceforth, which may be pulsed or continuous-wave) on the inspected structure. The pump beam is configured to be absorbed by the sample, so as induce an acoustic disturbance within the inspected structure.
  While the acoustic disturbance is ongoing, projecting an optical probe beam ("probe beam" henceforth, which may be pulsed or continuous-wave) on the inspected structure.
  Measuring an optical beam ("returned beam") returned from the inspected structure.

According to some embodiments of the method, the suboperations of projecting an optical pump beam, projecting an optical probe beam, and measuring a (returned) optical beam are repeated a plurality of times in order to increase a signal-to-noise ratio.

According to some embodiments of the method, the acoustic disturbance is constituted by an acoustic pulse, which is induced by heating of the sample caused by the absorbance of the pump beam. The acoustic pulse propagates within the inspected structure. The probe beam is Brillouin scattered off the acoustic pulse. More precisely, when the pump beam is pulsed, a plurality of acoustic pulses will be generated, and the probe beam will be scattered off each the acoustic pulses. In particular, when the probe beam is also pulsed, each of the probe pulses making up the probe beam will be scattered off a respective one of the acoustic pulses.

According to some embodiments of the method, the inspected structure includes a base positioned on, or forming part of, the sample. The inspected structure further includes vias (e.g. holes), which nominally vertically extend from a top surface of the inspected structure to the base or in a direction of the base. Each of the pump beam and the probe beam may be projected on the top surface of the inspected structure. The pump beam is configured to be absorbed by the base. The acoustic pulse travels from the base in a direction of the top surface of the inspected structure.

According to some embodiments of the method, the pump beam is a laser beam and the probe beam is a laser beam. According to some such embodiments, the pump beam and the probe beam are produced by a same laser source.

According to some embodiments of the method, the pump beam is pulsed laser beam, the probe beam is a pulsed laser, and the pump pulses in the pump beam and the probe pulses in the probe beam are alternating. The projection of the pump beam, the projection of the probe beam, and the measurement of the returned beam, are implemented $K \geq 2$ times. For each $1 \leq k \leq K$, each probe pulse in the k-th probe beam (i.e. in the k-th implementation) is delayed by a time delay $\Delta t_k$ relative to a respectively last projected of the pump pulses in the k-th pump beam, such that each of the probe pulses is scattered off a respective acoustic pulse, induced by the respectively last projected pump pulse, at a probed depth $\Delta z_k$, corresponding to the time delay $\Delta t_k$, within the inspected structure. According to some such embodiments, wherein the inspected structure is a V-NAND, K is on the order of 1000, and, for each $1 \le k \le K-1$, $\Delta t_{k+1} - \Delta t_k$ is on the order of 1 psec.

According to some embodiments of the method, the acousto-optic key measurement parameters specify a dependence of a frequency of Brillouin oscillations on the probed depth and/or a dependence of an amplitude of the Brillouin oscillations on the probed depth.

According to some embodiments of the method, the pump pulses and the probe pulses are generated by a same laser source.

According to some embodiments of the method, a waveform of each of the pump pulses is modulated by a modulation signal so as to be characterized by a carrier wave and an envelope. The envelope is configured to facilitate extraction, through demodulation, of contributions of returned portions of the K pulsed probe beams to the K acousto-optic measurement signals, respectively.

According to some embodiments of the method, the demodulation is performed using a lock-in amplifier which is fed the modulation signal.

According to some embodiments of the method, the carrier wave is configured to facilitate penetration of the respective pump pulse into the sample and absorption of the pump pulse in the base.

According to some embodiments of the method, the method further includes filtering the returned beam so as to (i) attenuate a first contribution to the returned beam relative to a second contribution to the returned beam, and/or (ii) attenuate background signals and/or noise. The first contribution is of a returned portion of the pump beam. The second contribution is of a returned portion of the probe beam.

According to some embodiments of the method, wherein the inspected structure includes vias, a wavelength of the probe pulse is at least about two times greater than a diameter of the vias and/or a distance therebetween. According to some such embodiments, wherein the inspected structure is a vertical-NAND (V-NAND) with adjacent vias being separated by a distance of about 50 nm, about 100 nm, or about 200 nm, the wavelength of the probe pulse may be at least about 100 nm, at least about 200 nm, or at least about 400 nm, respectively. Each possibility corresponds to separate embodiments.

According to some embodiments of the method, the scanning electron microscopy measurement data include one or more SEM signals of the inspected structure, obtained by sensing secondary and/or backscattered electrons generated as a result of scanning the inspected structure with an electron beam.

According to some embodiments of the method, the key measurement parameters, extracted from the scanning electron microscopy measurement data, include, for at least some of the vias, at least one first lateral geometrical feature characterizing an opening of the via, and/or at least one second lateral geometrical feature characterizing a bottom surface of the via.

According to some embodiments of the method, the key measurement parameters, extracted from the scanning electron microscopy measurement data, include, for at least some of the vias, at least one third lateral geometrical feature quantifying a lateral distance between the opening and the bottom surface.

According to some embodiments of the method, a landing energy of electrons in the electron beam may be between about 1 KeV and about 20 KeV, about 2 KeV and about 10 KeV, or about 3 KeV and about 7 KeV. Each possibility corresponds to separate embodiments. According to some embodiments, when sensing secondary electrons, a landing energy of electrons in the electron beam may be about 5 KeV.

According to some embodiments of the method, the scanning electron microscopy measurement data is obtained by successively scanning electron beams at a plurality of landing energies on the inspected structure, and measuring a plurality of SEM signals induced thereby.

According to some embodiments of the method, the SEM signals include one or more of secondary and/or backscattered electron signals (from which one or more SEM images may be generated), X-ray signals, cathodoluminescent light signals, and/or absorbed current signals.

According to some embodiments of the method, the inspected structure includes one or more nominally vertical projections and/or nominally vertical depressions.

According to some embodiments of the method, the key measurement parameters, extracted from the scanning electron microscopy measurement data, include at least one lateral geometrical feature of the inspected structure.

According to some embodiments of the method, a frequency, a waveform, and/or a polarization of the pump beam, and/or a frequency, a waveform, and/or a polarization of the probe beam, are selected so as to about maximize an intensity of the returned beam.

According to an aspect of some embodiments, there is provided a computerized system for non-destructive hybrid acousto-optic and scanning electron microscopy based metrology. The system includes a measurement setup and a computational module. The measurement setup includes an acousto-optic setup and a scanning electron microscope (SEM). The acousto-optic setup is configured to obtain acousto-optic measurement data of an inspected structure on a sample e.g. a semiconductor device such as a wafer. The SEM is configured to obtain scanning electron microscopy measurement data of the inspected structure. The computational module is configured to:

Process the obtained measurement data to extract values of key measurement parameters corresponding to the acousto-optic measurement data and the scanning electron microscopy measurement data, respectively.

Obtain estimated values of one or more structural parameters of the inspected structure by executing an algorithm, which is configured to jointly process the extracted values and thereby output estimated values of the one or more structural parameters.

According to some embodiments of the method, the algorithm is a ML-derived algorithm. According to some embodiments, the ML-derived algorithm is an ANN or a regression model. According to some embodiments, the ANN is a backward propagation neural network. According to some embodiments, the ANN is a forward propagation neural network.

According to some embodiments of the system, the algorithm is a search algorithm including an interpolator. The interpolator is configured to output interpolated values of the key measurement parameters when guesstimates of structural parameters are input thereinto (i.e. into the interpolator). The search algorithm may be configured to, starting from initial guesstimates of the structural parameters, repeatedly modify the guesstimates, until interpolated values of the key measurement parameters, obtained from the guesstimates, match the extracted values of the key measurement parameters to a required precision or, else, fail to converge.

According to some embodiments of the system, the interpolator is a ML-derived algorithm or is model-based. According to some embodiments, the interpolator is a forward propagation neural network.

According to some embodiments of the system, the acousto-optic setup includes light generating equipment and a light detector.

According to some embodiments of the system, the inspected structure is exposed. The light generating equipment is configured to:
- Project an optical pump beam ("pump beam" henceforth, which may be pulsed or continuous-wave) on the inspected structure. The optical pump beam is configured to be absorbed by the sample, so as induce an acoustic disturbance within the inspected structure.
- While the acoustic disturbance is ongoing, project an optical probe beam ("probe beam" henceforth, which may be pulsed or continuous-wave) on the inspected structure.

The light detector is configured to sense an optical beam ("returned beam") returned from the inspected structure, thereby obtaining at least part of the acousto-optic measurement data.

According to some embodiments of the system, the acousto-optic setup is configured to project the pump beam and the probe beam, and measure the returned beam, a plurality of times in order to increase a signal-to-noise ratio.

According to some embodiments of the system, the acoustic disturbance is constituted by an acoustic pulse, which is induced by heating of the sample caused by the absorbance of the pump beam. The acoustic pulse propagates within the inspected structure. The probe beam is configured to be Brillouin scattered off the acoustic pulse. More precisely, when the pump beam is pulsed, a plurality of acoustic pulses will be generated, and the probe beam will be scattered off each the acoustic pulses. In particular, when the probe beam is also pulsed, each of the probe pulses making up the probe beam will be scattered off a respective one of the acoustic pulses.

According to some embodiments of the system, the inspected structure includes a base positioned on, or forming part of, the sample. The inspected structure further includes vias, which nominally vertically extend from a top surface of the inspected structure to the base or in a direction of the base. The acousto-optic setup is configured to project the pump beam and the probe beam on the top surface of the inspected structure. The pump beam is configured to be absorbed by the base, so that the acoustic pulse travels from the base in a direction of the top surface of the inspected structure.

According to some embodiments of the system, the pump beam is a laser beam and the probe beam is a laser beam.

According to some embodiments of the system, the pump beam is pulsed and the probe beam is pulsed. The pump pulses in the pump beam and the probe pulses in the probe beam are alternating. The light generating equipment is configured to controllably vary a time delay time of the probe pulses relative to the pump pulses, respectively, thereby allowing to Brillouin scatter each probe pulse off a respective acoustic pulse, generated by a respectively last projected of the pump pulses (i.e. the last pump pulse projected before the probe pulse), at a controllable depth within the inspected structure.

According to some embodiments of the system, the acousto-optic setup is configured to project $K \geq 2$ pairs of the pump beam and the probe beam on the inspected structure. For each $1 \leq k \leq K$, each probe pulse in the k-th probe beam (i.e. the probe beam in the k-th pair) is delayed by a time delay $\Delta t_k$ relative to a respectively last projected pump pulse in the k-th pump beam (i.e. the pump beam in the k-th pair), thereby allowing to probe the inspected structure at each of K depths and obtain K corresponding acousto-optic measurement signals, respectively. The K acousto-optic measurement signals constitute at least part of the acousto-optic measurement data. According to some such embodiments, wherein the inspected structure is a V-NAND, K is on the order of 1000, and, for each $1 \leq k \leq K-1$, $\Delta t_{k+1} - \Delta t_k$ is on the order of 1 psec.

According to some embodiments of the system, the light generating equipment includes a variable delay line. The variable delay line is configured to controllably delay each probe pulse relative to a respectively last projected of the pump pulses, so as to allowing probing the inspected structure to a desired depth.

According to some embodiments of the system, the light generating equipment further includes a laser source, and a beam splitter, arranged such that a laser pulse, generated by the laser source, is split by the beam splitter into a first pulse portion and a second pulse portion. The first pulse portion constitutes, or is used in preparing, a respective pump pulse from the pump pulses. The second pulse portion is transmitted into the variable delay line, thereby generating a respective probe pulse from the probe pulses.

According to some embodiments of the system, the light generating equipment further includes an optical modulator, which is configured to modulate a waveform each of the first pulse potions, thereby preparing the pump pulses, respectively.

According to some embodiments of the system, the system further includes a lock-in amplifier. The optical modulator is configured to modulate a waveform of each of the first pulse portions such that each of the first pulse portions is characterized by a carrier wave and an envelope. The envelope is configured to facilitate extraction, through demodulation by the lock-in amplifier, of contributions of returned portions of the K pulsed probe beams to the K acousto-optic measurement signals, respectively.

According to some embodiments of the system, each of the carrier waves is configured to facilitate penetration of the respective pump pulse into the sample and absorption of the pump pulse in the base.

According to some embodiments of the system, the acousto-optic setup further includes an optical filter. The optical filter is configured to receive the returned beam and (i) attenuate a first contribution to the returned beam relative to a second contribution to the returned beam, and/or (ii) attenuate background signals and/or noise. The first contribution is of a returned portion of the pump beam. The second contribution is of a returned portion of the probe beam.

According to some embodiments of the system, a wavelength of the probe beam is at least about two times greater than a diameter of the vias and/or a distance therebetween. According to some such embodiments, wherein the inspected structure is a V-NAND with adjacent vias being separated by a distance of about 50 nm, about 100 nm, or about 200 nm, the wavelength of the probe pulse may be at least about 100 nm, at least about 200 nm, or at least about 400 nm, respectively. Each possibility corresponds to separate embodiments.

According to some embodiments of the system, the SEM includes (in addition to an electron beam source) one or more electron sensors configured to sense secondary electrons and/or backscattered electrons, one or more light sensors configured to sense X-ray light and/or cathodoluminescent light, and/or an absorbed current sensor.

According to some embodiments of the system, the electron beam source may be configured to generate an electron beam characterized by a landing energy (of electrons therein) of between about 1 KeV and about 20 KeV, about 2 KeV and about 10 KeV, or about 3 KeV and about 7 KeV. Each possibility corresponds to separate embodiments. According to some embodiments of the system, e.g. when sensing secondary electrons, the electron beam source may be configured to generate an electron beam characterized by a landing energy of about 5 KeV.

According to some embodiments of the system, the SEM is configured to successively scan electron beams at a plurality of landing energies on the inspected structure, and measure a plurality of SEM signals thus induced (secondary and/or backscattered electron signals (from which one or more SEM images may be generated), X-ray signals, cathodoluminescent light signals, and/or absorbed current signals), thereby obtaining the scanning electron microscopy measurement data.

According to some embodiments of the system, the plurality of SEM signals includes at least secondary electron intensity signals and/or backscattered electron intensity signals.

According to some embodiments of the system, the key measurement parameters, extracted from the scanning electron microscopy measurement data, include, for at least some of the vias, at least one first lateral geometrical feature and/or at least one second lateral geometrical feature. The at least one first lateral geometrical feature characterizes an opening of the via. The at least one second lateral geometrical feature characterizes a bottom surface of the via.

According to some embodiments of the system, the key measurement parameters, extracted from the scanning electron microscopy measurement data, includes, for at least some of the vias, at least one third lateral geometrical feature quantifying a lateral distance between the opening and the bottom surface.

According to some embodiments of the system, the inspected structure includes one or more nominally vertical projections and/or nominally vertical depressions. According to some such embodiments of the system, the key measurement parameters, extracted from the scanning electron microscopy measurement data, include at least one lateral geometrical feature of the inspected structure.

According to some embodiments of the system, the light generating equipment is configured to prepare the pump beam and the pump beam at respective frequencies, waveforms, and/or polarizations, such that an intensity of the returned beam is about maximized.

According to an aspect of some embodiments, there is provided a non-transitory computer-readable storage medium storing instructions that cause a computerized system—which includes an acousto-optic setup and a scanning electron microscope (SEM)—to:

Use the acousto-optic setup to obtain acousto-optic measurement data of an inspected structure on a sample.

Use the SEM to obtain scanning electron microscopy measurement data of the inspected structure.

Process the measurement data to extract values of key measurement parameters corresponding to the acousto-optic measurement data and the scanning electron microscopy measurement data, respectively.

Obtain estimated values of one or more structural parameters of the inspected structure by inputting the extracted values into an algorithm which (may be ML-derived and) is configured to jointly process the extracted values to output estimated values of the one or more structural parameters.

According to an aspect of some embodiments, there is provided a computerized system for non-destructive hybrid acousto-optic and scanning electron microscopy based metrology. The system includes a measurement setup and a computational module. The measurement setup includes an acousto-optic setup and a scanning electron microscope (SEM). The acousto-optic setup is configured to obtain acousto-optic measurement data of an inspected structure on a sample by repeated implementations, which includes:

Projecting an optical pump pulse on the sample, such that an acoustic pulse is produced within the inspected structure and propagates therein.

Projecting an optical probe pulse on the sample, such that the probe pulse undergoes Brillouin scattering off the acoustic pulse within the inspected structure.

Detecting a scattered component of the probe pulse, thereby obtaining a respective acoustic-optic measurement signal.

In each implementation the probe pulse is scattered off the acoustic pulse at a respective depth within the inspected structure. The SEM is configured to obtain SEM measurement data of the inspected structure. The computational module is configured to process the acousto-optic and SEM measurement data to estimate values of one or more structural parameters of the inspected structure.

Certain embodiments of the present disclosure may include some, all, or none of the above advantages. One or more other technical advantages may be readily apparent to those skilled in the art from the figures, descriptions, and claims included herein. Moreover, while specific advantages have been enumerated above, various embodiments may include all, some, or none of the enumerated advantages.

Unless otherwise defined, all technical and scientific terms used herein have the same meaning as commonly understood by one of ordinary skill in the art to which this disclosure pertains. In case of conflict, the patent specification, including definitions, governs. As used herein, the indefinite articles "a" and "an" mean "at least one" or "one or more" unless the context clearly dictates otherwise.

Unless specifically stated otherwise, as apparent from the disclosure, it is appreciated that, according to some embodiments, terms such as "processing", "computing", "calculating", "determining", "estimating", "assessing", "gauging" or the like, may refer to the action and/or processes of a computer or computing system, or similar electronic computing device, that manipulate and/or transform data, represented as physical (e.g. electronic) quantities within the computing system's registers and/or memories, into other data similarly represented as physical quantities within the computing system's memories, registers or other such information storage, transmission or display devices.

Embodiments of the present disclosure may include apparatuses for performing the methods herein. The apparatuses may be specially constructed for the desired purposes or may include a general-purpose computer(s) selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, flash memories, solid state drives (SSDs), or any other type of media suitable for storing electronic instructions, and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method(s). The desired structure(s) for a variety of these systems appear from the description below. In addition, embodiments of the present disclosure are not described with reference to any particular programming language. It will be appreciated that a variety of programming languages may be used to implement the teachings of the present disclosure as described herein.

Aspects of the disclosure may be described in the general context of computer-executable instructions, such as program modules, being executed by a computer. Generally, program modules include routines, programs, objects, components, data structures, and so forth, which perform particular tasks or implement particular abstract data types. Disclosed embodiments may also be practiced in distributed computing environments where tasks are performed by remote processing devices that are linked through a communications network. In a distributed computing environment, program modules may be located in both local and remote computer storage media including memory storage devices.

BRIEF DESCRIPTION OF THE DRAWINGS

Some embodiments of the disclosure are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the disclosure. For the sake of clarity, some objects depicted in the figures are not drawn to scale. Moreover, two different objects in the same figure may be drawn to different scales. In particular, the scale of some objects may be greatly exaggerated as compared to other objects in the same figure.

In the Figures.

DETAILED DESCRIPTION OF THE INVENTION

Figure 1:
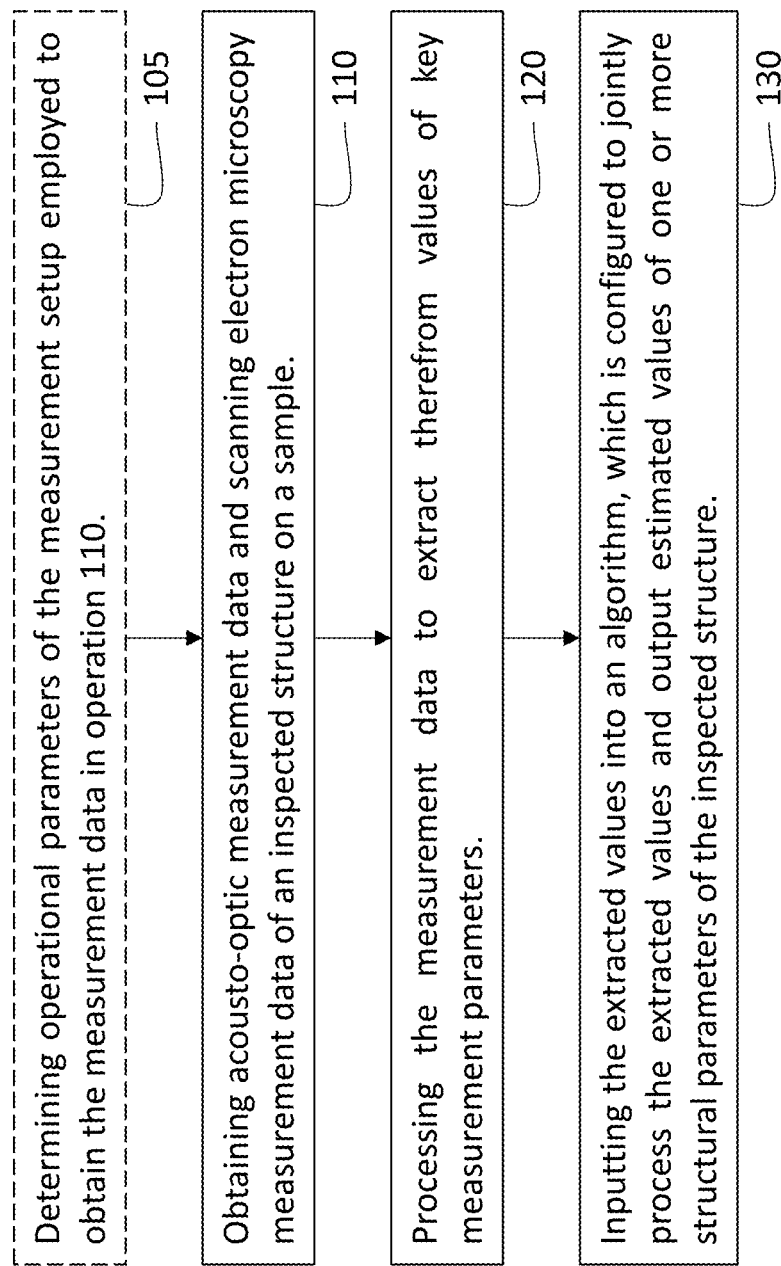
FIG. 1 presents a method for non-destructive hybrid acousto-optic and scanning electron microscopy based metrology, according to some embodiments.

The principles, uses, and implementations of the teachings herein may be better understood with reference to the accompanying description and figures. Upon perusal of the description and figures present herein, one skilled in the art will be able to implement the teachings herein without undue effort or experimentation. In the figures, same reference numerals refer to same parts throughout.

In the description and claims of the application, the words "include" and "have", and forms thereof, are not limited to members in a list with which the words may be associated.

As used herein, the term "about" may be used to specify a value of a quantity or parameter (e.g. the length of an element) to within a continuous range of values in the neighborhood of (and including) a given (stated) value. According to some embodiments, "about" may specify the value of a parameter to be between 80% and 120% of the given value. For example, the statement "the length of the element is equal to about 1 m" is equivalent to the statement "the length of the element is between 0.8 m and 1.2 m". According to some embodiments, "about" may specify the value of a parameter to be between 90% and 110% of the given value. According to some embodiments, "about" may specify the value of a parameter to be between 95% and 105% of the given value.

As used herein, according to some embodiments, the terms "substantially" and "about" may be interchangeable.

According to some embodiments, an estimated quantity or estimated parameter may be said to be "about optimized" or "about optimal" when falling within 5%, 10%, or even 20% of the optimal value thereof. Each possibility corresponds to separate embodiments. In particular, the expressions "about optimized" and "about optimal" also covers the case wherein the estimated quantity or estimated parameter is equal to the optimal value of the quantity or the parameter.

For ease of description, in some of the figures a three-dimensional cartesian coordinate system (with orthogonal axes x, y, and z) is introduced. It is noted that the orientation of the coordinate system relative to a depicted object may vary from one figure to another. Further, the symbol ⊙ may be used to represent an axis pointing "out of the page", while the symbol ⊗ may be used to represent an axis pointing "into the page".

In block diagrams and flowcharts, optional elements and operations, respectively, may appear within boxes delineated by a dashed line.

The present application is directed at combining acousto-optic profiling techniques and scanning electron microscopy to characterize a three-dimensional geometry, and, according to some embodiments, material composition, of an inspected structure. Advantageously, the joint processing of acousto-optic measurement data and scanning electron microscopy measurement data is synergistic in that it affords greater precision as compared to when the acousto-optic measurement data and the scanning electron microscopy measurement data are each processed alone. Moreover, the use of measurement data from different information channels, which correspond to different physics (i.e. acousto-optics on the one hand, and electron-matter interactions on the other hand), may remove "coupling" between structural parameters, that is, lift degeneracies, wherein one of the information channels is not sensitive to a change in a first structural parameter if accompanied by a certain change in second structural parameter.

Methods

According to an aspect of some embodiments, there is provided a method for non-destructive hybrid acousto-optic and scanning electron microscopy based metrology. FIG. 1 presents a flowchart of such a method, a method 100, according to some embodiments. Method 100 includes:

An operation 110, wherein acousto-optic measurement data and scanning electron microscopy measurement of an inspected structure on a sample (e.g. a semiconductor device, such as a wafer) are obtained.

An operation 120, wherein the measurement data are processed to extract values of key measurement parameters.

An operation 130, wherein estimated values of one or more structural parameters of the inspected structure are obtained by inputting the extracted values into an algorithm, which is configured to, based at least on joint processing of the extracted values, output estimated values of the one or more structural parameters.

Figure 6:
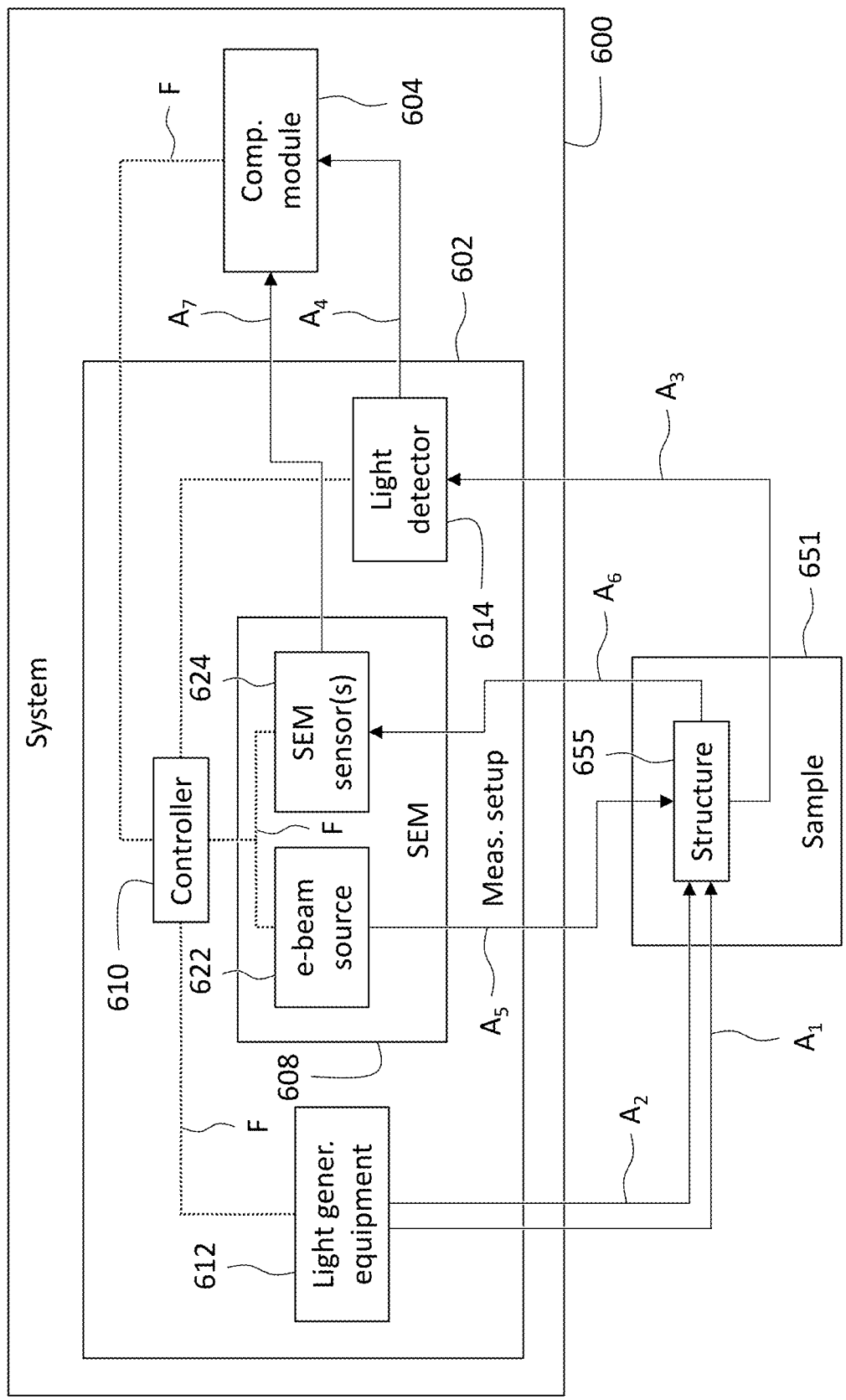
FIG. 6 presents a computerized system for non-destructive hybrid acousto-optic and scanning electron microscopy based metrology, according to some embodiments.

Method 100 may be implemented using a computerized system, such as the computerized system, which is described below in the description of FIG. 6, or a computerized system similar thereto.

The skilled person will readily perceive that the order in which the above operations are listed is not unique and other applicable orders are also covered by the present disclosure. In particular, in order to increase the signal-to-noise ratio (SNR), and thereby increase the estimation accuracy of the one or more structural parameters of the inspected structure, according to some embodiments, operation 110 may be repeated a plurality of times. According to some such embodiments, in operation 120 the key measurement parameters may be extracted taking into account the measurement data obtained in each of the repetitions of operation 110.

According to some embodiments, and as elaborated on below, in operation 130, the algorithm may be a machine-learning (ML) derived algorithm, such as an artificial neural network (ANN) or a regression model. According to some embodiments, the ANN may be a backward propagation neural network. According to some embodiments, the ANN may be a forward propagation neural network, as described in the description of FIG. 2A according to some specific embodiments thereof.

According to some embodiments, the acousto-optic measurement data may be obtained by projecting an optical pump beam on the sample. According to some embodiments, the pump beam may be projected directly on the inspected structure. The pump beam is configured to be absorbed by the sample so as to induce an acoustic disturbance(s) within the inspected structure.

While the acoustic disturbance is ongoing (i.e. before the acoustic disturbance has died out), an optical probe beam is projected on the sample. According to some embodiments, the probe beam may be projected directly on the inspected structure. An optical beam, returned from the inspected structure (also referred to as "returned beam"), is measured. The measurement data thus obtained constitutes the acousto-optic measurement data or at least a part thereof. According to some embodiments, the acoustic disturbance may be a localized pressure wave (also referred to as "acoustic pulse"), which propagates along the inspected structure. In such embodiments, the probe beam may be configured to penetrate into the inspected structure and to be Brillouin scattered off the pressure wave.

According to some embodiments, and as described in detail in the description of FIGS. 3-4G, and FIG. 7 below, a plurality of pump beams may be projected, one at a time, on the sample. Each of the pump beams may lead to the formation of a respective localized pressure wave. According to some such embodiments, a plurality of probe beams may be projected, one at a time, on the sample, so as to undergo Brillouin scattering off the respective pressure wave at each of a plurality of depths, respectively, within the inspected structure. Consequently, the inspected structure is "probed" at a plurality of depths therein, so as to allow three-dimensionally profiling of the inspected structure.

According to some embodiments, a frequency, a waveform, and/or a polarization of the pump beam(s), and/or a frequency, waveform, and/or a polarization of the probe beam(s) are selected such that an intensity of the returned portion of the probe beam(s) is about maximized. According to some embodiments, a frequency, a waveform, and/or a polarization of the pump beam(s), and/or a frequency, waveform, and/or a polarization of the probe beam(s) are selected so as to facilitate separating or at least distinguishing (e.g. using optical filtering, demodulation, and/or signal processing techniques) a returned portion of the probe beam(s) from a returned portion of the pump beam(s).

According to some embodiments, in operation 110, the acousto-optic measurement data, or some of the acousto-optic measurement data, may be obtained using a fast optical detector to measure the temporal dependence of the intensity of the returned beam(s). Additionally, or alternatively, according to some embodiments, an optical spectrometer may be employed to measure the frequency spectrum of the returned beam(s).

According to some embodiments, the scanning electron microscopy measurement data may be obtained by sensing secondary electrons and/or backscattered electrons generated by scanning an e-beam on the inspected structure. Additionally, or alternatively, the scanning electron microscopy measurement data may be obtained by sensing X-ray radiation and/or cathodoluminescent light generated by scanning an e-beam on the inspected structure, and/or by measuring an absorbed current signal thus generated.

According to some embodiments, wherein secondary electrons and/or backscattered (produced by the striking of the e-beams on the inspected structure) are sensed, the obtained measurement signals may be preprocessed into a SEM image of the inspected structure. Such preprocessing may include noise reduction, brightness and contrast adjustments, and so on.

According to some embodiments, the inspected structure may be scanned with an e-beam a plurality of times. According to some embodiments, the inspected structure may be scanned with e-beams which differ from one another in the landing energies of the electrons in the e-beam.

According to some embodiments, in operation 120, the acousto-optic measurement data may be processed to extract values of key measurement parameters in a first set, and the scanning electron microscopy measurement data may be processed to extract therefrom values of key measurement parameters in a second set. According to some embodiments, the extraction of the first set of key measurement parameters may be implemented using signal processing tools. According to some such embodiments, the signal processing tools may be machine-learning based. According to some embodiments, the extraction of the second set of key measurement parameters may be implemented using image processing tools, for example, when derived from SEM images. According to some such embodiments, the image processing tools may be machine-learning based.

According to some embodiments, in addition to a first measurement signal associated with a returned (reflected and scattered off the inspected structure) portion of the probe beam, the acousto-optic measurement data may also include a second measurement signal associated with a returned portion of the pump beam. In such embodiments, operation 120 may include identifying, or otherwise "distilling", the first measurement signal. The first set of key measurement parameters may include parameters characterizing or derivable from the first measurement signal or may even be constituted by the first measurement signal.

According to some embodiments, wherein the inspected structure includes projections and/or depressions (for example, vias), the second set of key measurement parameters may include lateral geometrical features of the projections and/or the depressions, such as the areas of the projections and/or depressions, the shapes of the areas, or diameters thereof when substantially circular. Some non-limiting examples of key measurement parameters, which may be included in the second set—in some specific embodiments of method 100 wherein the inspected structure includes vias—are listed below in the description of FIGS. 5A and 5B.

According to some embodiments, wherein the algorithm in operation 130 is a ML-derived algorithm, the algorithm may be an ANN, such as a deep neural network, or a regression model, such as a linear regression model or a polynomial regression model.

According to some embodiments, the ML-derived algorithm may be trained using fully labeled, partially labeled, and/or unlabeled training data. Training data may be obtained by applying operations 110 and 120 to a plurality of structures. To label the training data of a structure, lamellas extracted from the structures and/or slices shaved thereof may be profiled using scanning and/or transmission electron microscopy, atomic force microscopy, and/or soft X-ray microscopy. According to some embodiments, the plurality of structures may include structures fabricated to the same (intended) design and/or similar (intended) designs. Additionally, or alternatively, pre-existing data (e.g. previously obtained in another context) may be used as training data. For example, previously obtained SEM images of similar structures (such data may be labeled or unlabeled). Finally, according to some embodiments, data obtained through computer simulations of the application of operations 110 and 120 to a plurality of structures may also be used as training data.

According to some embodiments, the ML-derived algorithm may depend on operational parameters of the measurement setup used to implement operation 110, such as, for example, preparation parameters of the pump beam(s), probe beam(s), and the e-beam(s), and collection parameters thereof. Put differently, depending on the operational parameters, different ML-derived algorithms may be used. Additionally, or alternatively, according to some embodiments, the choice of key measurement parameters may depend on the operational parameters of the measurement setup.

As non-limiting examples, the preparation parameters may include intensities, polarizations, waveforms, and/or incidence angles of the pump beam(s) and the probe beam(s). Similarly, the preparation parameters may include, for example, the landing energies of electrons in the e-beam(s) and the overall electrical current of the e-beam(s). The collection parameters may include, for example, parameters of an optical filter (e.g. the polarization of the filter) in embodiments wherein the returned beam(s) is filtered.

According to some such embodiments, wherein the ML-derived algorithm is an ANN, the architecture of the ANN may depend on the operational parameters, e.g. some or all of the weights of the ANN, the number of nodes, and/or even the number of layers may depend on the operational parameters. Additionally, or alternatively, according to some embodiments, in addition to the extracted values of the key measurement parameters, the ANN may be further be configured to receive as inputs at least some of the operational parameters or one or more functions thereof.

Further, the type of ANN (e.g. CNN, fully connected, generative adversarial network) may depend on the type of inputs (i.e. the key measurement parameters). For example, according to some embodiments, a fully connected ANN may be used when the inputs are sparse values (e.g. spectrum peaks), and a CNN may be used when the inputs are sequentially sampled (and, more generally, indexed), e.g. include a temporal signal or an image.

Optionally, according to some embodiments, particularly embodiments wherein the inspected structure is characterized by a geometry that significantly differs from previously profiled geometries, method 100 may include an initial operation 105 wherein the operational parameters of the measurement setup are determined by way of measurements. According to some embodiments, operation 105 may involve analyzing measurement data obtained for different choices of operational parameters, so as to identify about optimal operational parameters. That is, the choice of operational parameters for which method 100 will provide the most accurate, or about the most accurate, profiling of the inspected structure. In this regard it is noted in determining the optimal operational parameters, typically, not only the optimality with respect to the algorithm of operation 130 must be taken into account but also the extraction precision of the key measurement parameters, as well as the accuracy of the measurement data (which will generally vary with the choice of operational parameters). In particular, operational parameters such as intensities of the pump beam(s), probe beam(s), e-beam(s), a spectral range (bandpass) of an optical filter used to filter the returned beam(s) prior to sensing thereof, a bandwidth of the output signal of the light detector used to sense the returned beam(s), and so on, may each affect the accuracy of the measurement data. Thus, according to some embodiments, the optimal operational parameters may be associated with comparatively less noise and higher SNRs.

Operation 105 may include obtaining acousto-optic measurement data and scanning electron microscopy measurement data for a plurality of preparations of the pump beams and probe beams and/or the e-beams. According to some embodiments, the plurality of preparations may include: (i) pump beam preparations differing from one another in one or more of wavelength, waveform, polarization, intensity, and incidence angle, (ii) probe beam preparations differing from one another in one or more of wavelength, waveform, polarization, intensity, and incidence angle, and (iii) e-beam preparations differing from one another in one or more of the landing energy of the electrons in the e-beam and intensity.

Operation 105 may further include obtaining acousto-optic measurement data and scanning electron microscopy measurement data for different collection settings, which may differ from one another in the spectral range of the light detector(s) used to sense (e.g. measure intensity) of the returned beam, the bandwidth of the (e.g. voltage) signal output by the light detector(s), a polarization angle of a polarization filter in embodiments wherein the returned beam is filtered prior to being sensed, a bandwidth of the (e.g. voltage) signal output by the SEM sensor(s), the choice of SEM sensor(s) (e.g. a secondary electron sensor or a backscattered electron sensor), and, accordingly, the landing energies of the e-beams produced by the SEM, and so on.

Figure 2A:
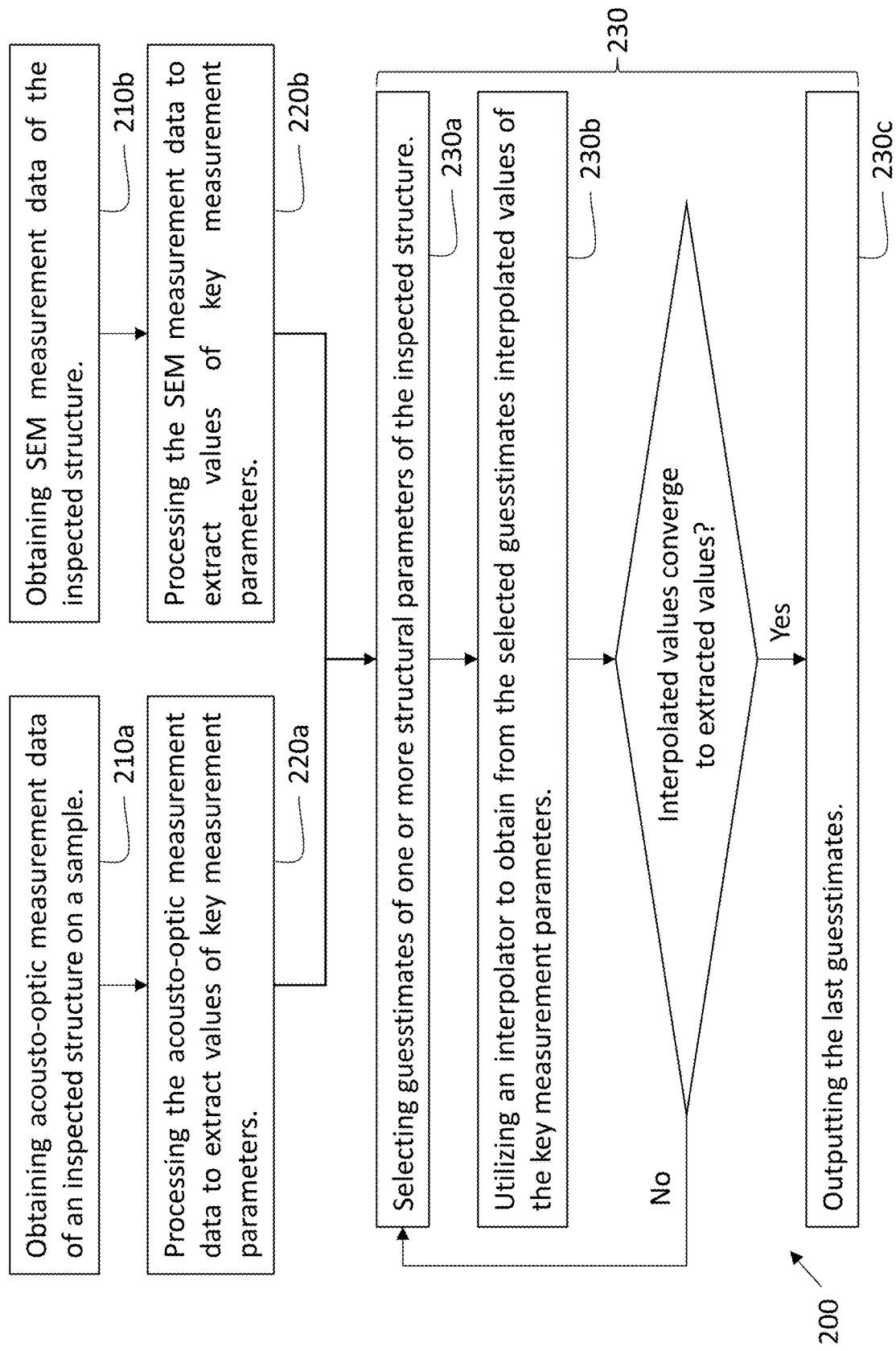
FIG. 2A presents a method for non-destructive hybrid acousto-optic and scanning electron microscopy based metrology, which corresponds to specific embodiments of the method of FIG. 1.

FIG. 2A presents a flowchart of a method 200 for non-destructive hybrid acousto-optic and scanning electron microscopy based metrology, according to some embodiments. Method 200 corresponds to specific embodiments of method 100. Method 200 includes:

An operation 210a, wherein acousto-optic measurement data of an inspected structure on a sample (e.g. a semiconductor device, such as a wafer) are obtained.

An operation 210b, wherein scanning electron microscopy measurement data of the inspected structure are obtained.

An operation 220a, wherein the acousto-optic measurement data are processed to extract values of key measurement parameters in a first set (which corresponds to the acousto-optic measurement data).

An operation 220b, wherein the scanning electron microscopy measurement data are processed to extract values of key measurement parameters in a second set (which corresponds to the scanning electron microscopy measurement data).

An operation 230, wherein estimated values of one or more structural parameters of the inspected structure are obtained by:

A suboperation 230a, wherein guesstimates (i.e. calculated/educated guesses) of the one or more structural parameters of the inspected structure are selected.

A suboperation 230b, wherein an interpolator is utilized to obtain from the selected guesstimates interpolated values of the key measurement parameters (from both the first set and the second set).

If the interpolated values do not match the extracted values to a required precision, then suboperations 230a and 230b are repeated (i.e. new guesstimates are selected—in other words, the guesstimates are updated—in the repetition of sub operation 230a and suboperation 230b is repeated with respect therewith). Otherwise (i.e. when the interpolated values match the extracted values to the required precision), proceeding to:

A suboperation 230c, wherein the guesstimates are output (as the estimated values).

Operations 210a and 210b jointly correspond to specific embodiments of operation 110 of method 100. Operations 220a and 220b jointly correspond to specific embodiments of operation 120 of method 100. Operations 230a-230c jointly correspond to specific embodiments of operation 130 of method 100. According to some embodiments, method 200 may include an initial operation (not listed in FIG. 2A), which corresponds to specific embodiments of operation 105 of method 100, wherein operational parameters of the measurement setup used to implement operations 210a and 210b are selected.

Method 200 may be implemented using a computerized system, such as the computerized system, which is described below in the description of FIG. 6, or a computerized system similar thereto.

The skilled person will readily perceive that the order in which the above operations are listed is not unique and that other applicable orders fall within the scope of the present disclosure. For example, according to some embodiments, operation 210b, and, optionally, also operation 220b, may be implemented prior to operation 210a. Further, in order to increase SNR of the acousto-optic measurement data, and thereby increase the estimation accuracy of the one or more structural parameters of the inspected structure, according to some embodiments, operation 210a may be repeated a plurality of times. According to some such embodiments, in operation 220a the values of the acousto-optic key measurement parameters may be extracted taking into account the measurement data obtained in each of the repetitions of operation 210a. Similarly, according to some embodiments, in order to increase SNR of the scanning electron microscopy measurement data, and thereby increase the estimation accuracy of the one or more structural parameters of the inspected structure, according to some embodiments, operation 210b may be repeated a plurality of times. According to some such embodiments, in operation 220b the values of the scanning electron microscopy key measurement parameters may be extracted taking into account the measurement data obtained in each of the repetitions of operation 210b.

In sub operation 230b, the interpolator may be a ML-derived algorithm configured to have input thereinto the values of the one or more structural parameters and to output values of key measurement parameters in the first set and the second set. According to some embodiments, the ML-derived algorithm may be an ANN (e.g. a deep neural network) or a regression model (e.g. a linear regression model). As non-limiting examples, according to some embodiments, the ANN may be a convolutional neural network, a fully connected neural network, or a generative adversarial network (GAN).

According to some embodiments, wherein the interpolator is an ML-derived algorithm, the interpolator may be trained using training data, which may be fully labeled, partially labeled, or unlabeled, essentially as described above in the description of operation 130 of method 100. According to some embodiments, the training data may be obtained by applying operations 210a, 210b, 220a, and 220b to a plurality of structures, which may include structures fabricated to the same (intended) design or similar (intended) designs. According to some such embodiments, some or all of the training data may be labeled by using scanning and/or transmission electron microscopy—and/or other metrology techniques, such as atomic force microscopy and/or soft X-ray microscopy—to profile lamellas extracted from the structures and/or slices shaved thereof. According to some embodiments, in addition to structures fabricated to the same (intended) design or similar (intended) designs, the plurality of structures may include structures whose intended designs differ significantly, particularly structures whose dimensions are extremal.

According to some alternative embodiments, the algorithm of suboperation 230b may be non-ML-derived. That is, the form of the algorithm may be derived analytically (from physical modeling) and/or through computer simulation of the inspected structure and the measurement setup. According to some such embodiments, wherein in operation 210a a pump beam(s) and a probe beam(s) are used to generate the acousto-optic measurement data, the computer simulation may model the interaction between the pump beam(s) and probe beam(s) and the inspected structure, as well as the interaction between the e-beam(s) and the inspected structure. In particular, the computer simulation may model the propagation within the inspected structure of an acoustic pulse(s), induced by the pump beam(s), the Brillouin scattering of the probe beam(s) off the acoustic pulse(s).

Sub operation 230a, particularly the repetitions thereof (when necessary), may be implemented using an iterative search algorithm. According to some embodiments, the search algorithm may incorporate the interpolator: In each repetition of suboperation 230a, the search algorithm updates the guesstimates of the one or more structural parameters taking into account the guesstimates, selected in the previous repetition of operation 230a, and the interpolated values obtained in the last repetition of 230b. The search algorithm may be, or incorporate, an optimization algorithm, which may be configured to minimize a cost function quantifying a distance between the interpolated values (obtained from the last guesstimates) and the extracted values of the key measurement parameters (obtained from the measurement data). According to some such embodiments, the cost function may be a function of the differences between corresponding interpolated values and extracted values.

The optimization algorithm may be a known search algorithm, such as a stochastic gradient descent algorithm. According to some embodiments, wherein the cost function is a sum of squares, the optimization algorithm may be a nonlinear least squares algorithm, such as a Levenberg-Marquardt algorithm. Other options—pertinent also for other cost functions besides sum of squares—may include, for instance, extensions of the gradient descent algorithm, such as the adaptive movement estimation algorithm (Adam) or the Nesterov-accelerated adaptive moment estimation algorithm (Nadam).

According to some embodiments, wherein the interpolator is or incorporates a GAN, the cost function may be, for example, a maximum absolute error, Kullback-Leibler divergence, or a cross entropy. Alternatively, the GAN may dynamically generate the cost function.

According to some alternative embodiments, an alternative convergence criterion may be employed. In particular, according to some such embodiments, following the first implementation of suboperation 230b, suboperation 230a is implemented again and updated guesstimates are computed taking into account the interpolated values computed in the first implementation of sub operation 230b. Then, starting from the second implementation of suboperation 230a, and prior to the next implementation of suboperation 230b, instead of checking after suboperation 230b whether the interpolated values match the extracted values to a required precision, it is checked after suboperation 230a whether the updated guesstimates (obtained in the last implementation of suboperation 230a) match the previous guesstimates (obtained in the implementation of suboperation 230a before the last one) to a required precision. If so, then suboperation 230c is implemented next and the updated guesstimates are output. If not, then suboperation 230b is implemented next, and so on.

According to some alternative embodiments, not shown in FIG. 2A, some or all of the key measurement parameters are not derivable solely from the acousto-optic measurement or solely from the scanning electron microscopy measurement data but are jointly derived from both.

Figure 2B:
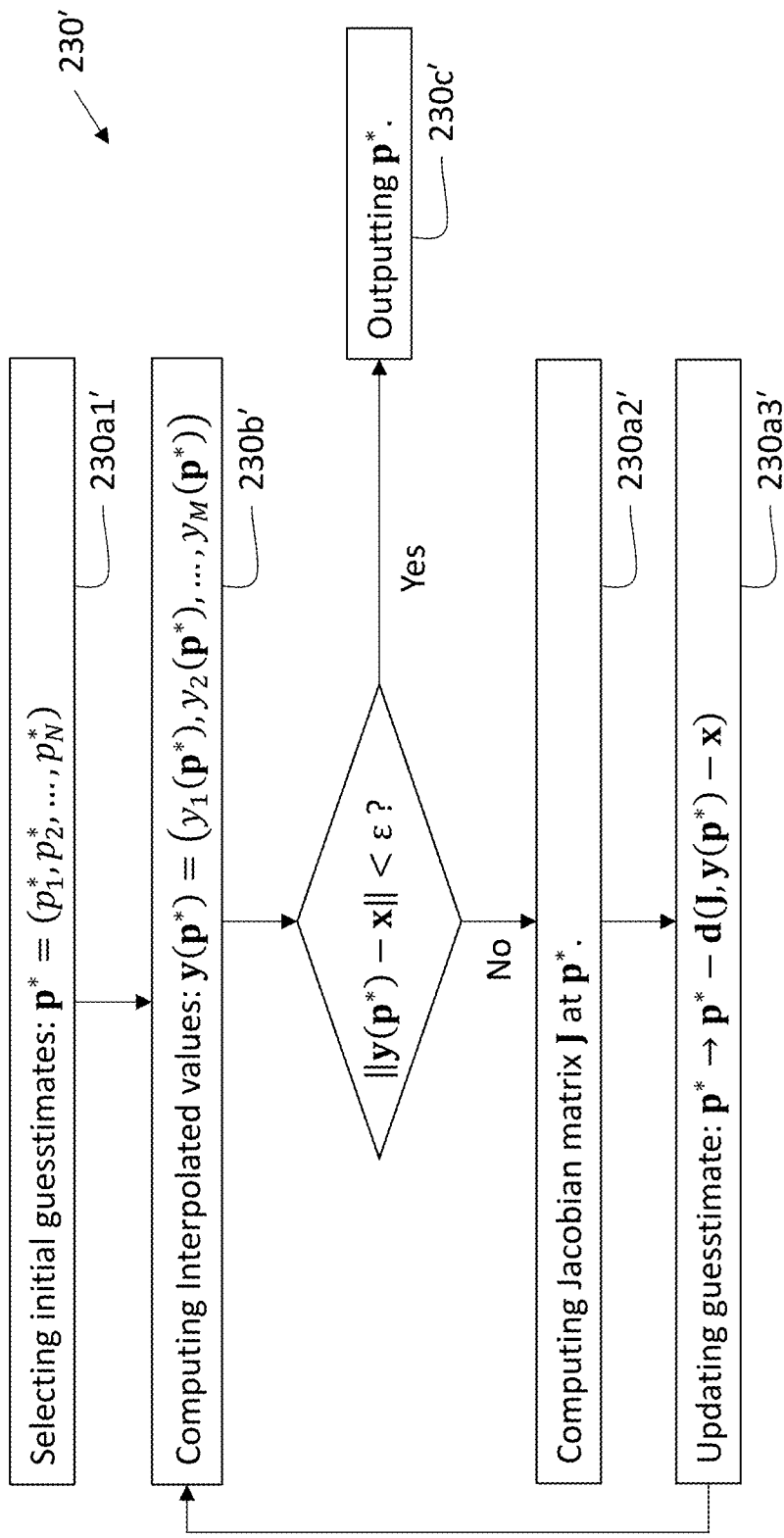
FIG. 2B is a flowchart detailing computation of estimated values one or more structural parameters of ab inspected structure from (processed) measurement data thereof, according to some specific embodiments of the method of FIG. 2A.

FIG. 2B presents a flowchart of an operation 230' for estimating values of one or more structural parameters of an inspected structure from key measurement parameters thereof, according to some embodiments. Operation 230' corresponds to specific embodiments of operation 230 (of method 200), according to some specific embodiments thereof. Operation 230' includes:

A suboperation 230a1', wherein initial guesstimates of structural parameters of the inspected structure are selected. The guesstimates are specified by a vector $p^*=(p^*_1, p^*_2, p^*_N)$, wherein the $p^*_i$ are guessed values of the structural parameters.

A suboperation 230b', wherein interpolated values of key measurement parameters are computed. The interpolated values are specified by a vector $y(p^*)=(y_1(p^*), y_2(p^*), \ldots, y_M(p^*))$. If $\|y(p^*)-x\| \leq \varepsilon$, suboperation 230c' is next implemented. Otherwise, suboperation 230a2' is next implemented. Here x is a (M-component) vector specifying extracted values of the key measurement parameters, obtained from the measurement data, and the double vertical brackets denote a norm (quantifying a distance). The value of $\varepsilon$ is selected according to accuracy requirements.

A suboperation 230a2', wherein a Jacobian matrix J at $p^*$ is computed.

A suboperation 230a3', wherein $p^*$ is updated by subtracting therefrom a (N-component) vector function $d(J, y(p^*)-x)$ (i.e. d is a function of J and the difference vector $y(p^*)-x$). Sub operation 230b' is next repeated.

A suboperation 230c', wherein $p^*$ is output.

Sub operations 230a1', 230a2', and 230a3' jointly correspond to specific embodiments of sub operation 230a of method 200. Sub operations 230b' and 230c' correspond to specific embodiments of sub operations 230b and 230c, respectively, of method 200.

Figure 3:
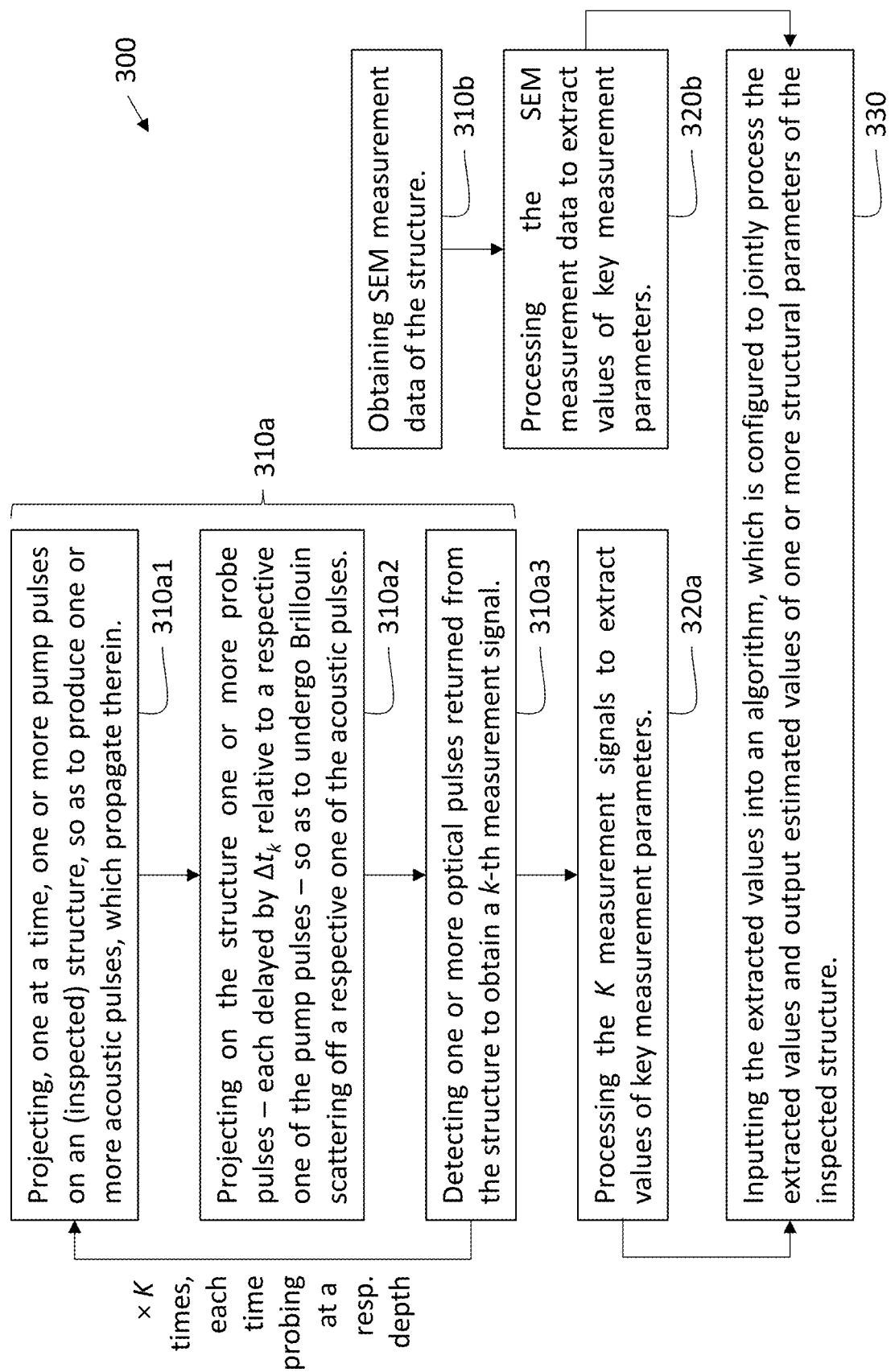
FIG. 3 presents a method for non-destructive hybrid acousto-optic and scanning electron microscopy based metrology, which corresponds to specific embodiments of the method of FIG. 1.

FIG. 3 presents a flowchart of a method 300 for non-destructive hybrid acousto-optic and scanning electron microscopy based metrology, according to some embodiments. Method 300 corresponds to specific embodiments of method 100. According to some embodiments, method 300 corresponds to specific embodiments of method 200. Method 300 includes:

An operation 310a, wherein acousto-optic measurement data of an inspected structure on a sample are obtained by performing consecutively, for each of a plurality of K time delays in a set of time delays $\{\Delta t_k\}_{k=1}^{K}$, or, equivalently, for each k=1, 2, 3, . . . , K:

A sub operation 310a1, wherein one or more (optical) pump pulses are projected on an inspected structure, one at a time, so as to produce corresponding one or more acoustic pulses, which vertically propagate (or at least have a vertical propagation component) in the inspected structure.

A suboperation 310a2, wherein one or more (optical) probe pulses, each of which being delayed by the time delay $\Delta t_k$ relative to a respective one of the pump pulses, are projected on the inspected structure, so as to penetrate thereinto and undergo Brillouin scattering off the acoustic pulse, generated by the respective pump pulse, at a k-th depth within the inspected structure.

A sub operation 310a3, wherein one or more optical pulses (referred to as "returned pulses") returned from the inspected structure are measured to obtain a k-th acousto-optic measurement signal (e.g. an intensity signal).

An operation 310b, wherein scanning electron microscopy measurement data of the inspected structure are obtained.

An operation 320a, wherein the K acousto-optic measurement signals are processed to extract values of acousto-optic key measurement parameters.

An operation 320b, wherein the scanning electron microscopy measurement data are processed to extract values of scanning electron microscopy key measurement parameters.

An operation 330, wherein estimated values of one or more structural parameters of the inspected structure are obtained by inputting the acousto-optic extracted values, and the scanning electron microscopy extracted values, into an algorithm, which is configured to, based at least on joint processing of the extracted values, output estimated values of the one or more structural parameters.

Operations 310a and 310b jointly correspond to specific embodiments of operation 110 of method 100. Operations 320a and 320b jointly correspond to specific embodiments of operation 120 of method 100. According to some embodiments, operation 320a may include generating a spectrogram from the plurality of acousto-optic measurement signals from which parameters of Brillouin oscillations, exhibited by the returned portion of the probe pulses, and the dependence thereof on the depth, may be extracted. According to some embodiments, wherein in operation 310b secondary and/or backscattered electrons are sensed, operation 320b may include preprocessing of the measurement data to generate therefrom a SEM image. Such preprocessing may include noise reduction, brightness and contrast adjustments, and so on. Further, according to some embodiments, operation 320b may include identifying shapes/patterns in the SEM image using a feature extraction algorithm. For example, in embodiments wherein the inspected structure includes vias, an algorithm for circle (or ellipse) detection, such as a Hough transform, may be applied.

According to some embodiments, method 300 may include an initial operation (not listed in FIG. 3), which corresponds to specific embodiments of operation 105 of method 100, wherein operational parameters of the measurement setup, used to implement operations 310a and 310b, are selected.

According to some embodiments, wherein method 300 corresponds to specific embodiments of method 200, operation 330 includes suboperations corresponding to specific embodiments of suboperations 230a-230c of operation 230. In particular, in such embodiments, operation 330 may be implemented using an interpolator (e.g. a deep neural network): Guesstimates of the one or more structural parameters are iteratively updated until interpolated values of the acousto-optic key measurement parameters and scanning electron microscopy key measurement parameters, obtained from the guesstimates, match to a required precision the extracted values of the acousto-optic key measurement parameters (obtained in operation 320a) and the scanning electron microscopy key measurement parameters (obtained in operation 320b).

Method 300, according to some embodiments thereof, may be implemented using a computerized system, such as the computerized system, which is described below in the description of FIG. 7, or a computerized system similar thereto.

According to some embodiments, in operation 330, the algorithm may be a machine-learning (ML) derived algorithm, such as an ANN or a regression model. According to some embodiments, the ANN may be a backward propagation neural network. According to some embodiments, the ANN may be a forward propagation neural network.

The skilled person will readily perceive that the order in which the above operations are listed is not unique and that other applicable orders fall within the scope of the present disclosure. For example, according to some embodiments, operation 310b, and, optionally, also operation 320b (which is performed after operation 310b), may be implemented prior to operation 310a.

According to some alternative embodiments, not shown in FIG. 3, some or all of the key measurement parameters may not be derivable solely from the acousto-optic measurement or solely from the scanning electron microscopy measurement data but are jointly derived from both.

According to some embodiments, in operation 310a the probe pulses may be projected on an exposed surface of the inspected structure. According to some such embodiments, in operation 310a, the pump pulses may be projected on the same exposed surface. In FIGS. 4A-4G, to facilitate the description, the exposed surface is depicted as the top surface of the inspected structure, and is therefore referred to as such. Similarly, in FIGS. 5A and 5B, the exposed surface is depicted as the top surface of the inspected structure, and is therefore referred to as such.

According to some embodiments, each of the pump pulses (after modulation) may be characterized by a respective carrier wave (e.g. the frequency of the laser source) and envelope. The envelope may be configured to facilitate the separation of a returned portion of a pulsed probe beam (e.g. prepared in an implementation of suboperation 310a2) from a returned portion of the respective pulsed pump beam (e.g. prepared in a corresponding implementation of suboperation 310a1, and which includes modulated pump pulses) and/or background signals and noise, as described below in the description of the computerized system of FIG. 7. The carrier wave may be configured to facilitate penetration of the pump pulse into the inspected structure. According to some embodiments, and as depicted, for example, in FIGS. 4D-4F, the carrier wave may be configured to facilitate absorption of the pump pulse in a specific region (referred to as "absorption region") of the sample (which may or may not be included in the inspected structure).

The heating of the absorption region leads to the expansion thereof, which, in turn, results in the generation of an acoustic pulse. As the acoustic pulse propagates within the sample, and, in particular, within the inspected structure, the acoustic pulse temporarily locally modifies the density distribution across the segment whereat the acoustic pulse is momentarily localized. This in turn leads to a temporary modification in the refractive index due to the elasto-optic effect. These changes in the refractive index may be sensed through Brillouin scattering.

According to some embodiments, for example, embodiments wherein the inspected structure is a FinFET (i.e. a fin field-effect transistor) or a similarly shaped structure (i.e. including parallel fins), the absorption region may be positioned adjacently to a top surface of the inspected structure. The acoustic pulses, off which the probe pulses are scattered, then propagate away the top surface. In such embodiments, the probed depth (that is, the depth at which the probe pulse is scattered off the acoustic pulse) increases as the time delay (i.e. the time interval by which the probe pulse is delayed relative to the pump pulse) is increased.

Alternatively, according to some embodiments, and as depicted in FIGS. 4C-4G, the inspected structure may be transparent, or substantially transparent, to the pump pulses but a base, on which the inspected structure is mounted, is not. The absorption region may then be in the form of a layer—within the base—adjacent to the inspected structure from below. The acoustic pulses, off which the probe pulses are scattered, then propagate away from the layer and towards the top surface of the inspected structure. In such embodiments, the probed depth (that is, the depth at which the probe pulse is scattered off the acoustic pulse) decreases as the delay is increased.

According to some embodiments, $\Delta t_k = \tau_F + \Sigma_{j=1}^{k} \delta t_j$, wherein $\tau_F$ denotes the time taken for the acoustic pulse to form and the $\delta t_{j+1}$ denotes the extra time by which the probe pulses, generated in the (j+1)-th implementation of operation 310a, are delayed as compared to the probe pulses generated in the j-th implementation of operation 310a. According to some such embodiments, $\Delta t_k = \tau_F + (k-1) \cdot \delta t$. The values of K (k=1, 2, 3, . . . , K) and $\delta t$ (or, more generally, each of the $\Delta t_k$, when for at least some pairs k and j≠k, $\delta t_k \neq \delta t_j$) may be selected taking into account the depth of the inspected structure and the desired (spatial) vertical profiling resolution (at least along the vertical direction). The vertical profiling resolution is determined by the temporal sampling resolution (e.g. $\delta t$) and the (vertical) width $\Delta z$ of the acoustic pulse width, which in turn is determined by the pump wavelength and the material composition of the inspected structure. By way of example, in a uniform medium the acoustic pulse propagates a distance of $v_s \cdot \delta t$ during each sampling interval, so that the vertical profiling resolution is a function of $v_s \cdot \delta t$ and $\Delta z$. According to some such embodiments, the vertical resolution may be about equal to the greater of the two (i.e. about equal to $\max\{v_s \cdot \delta t, \Delta z\}$).

In a non-uniform medium both the speed of sound and the acoustic pulse width may depend on the depth. Accordingly, the vertical profiling resolution may depend on the depth, and the overall vertical profiling resolution may be about equal to $$\max\{\max_k\{v_s^{(k)} \cdot (\Delta t_{k+1} - \Delta t_k)\}, \max_k\{\Delta z_k\}\},$$

wherein $v_s^{(k)}$ and $\Delta z_k$ are the speed of sound and the acoustic pulse width, respectively, in a segment probed by the probe pulses generated in the k-th implementation of operation 310a.

As a non-limiting example, according to some embodiments, wherein the inspected structure is a V-NAND, K may be on the order of 1000, $\Delta t_K$ may be smaller than about 2 nsec (nanosecond), and $\delta t$ may be on the order of 1 psec (picosecond), leading to a vertical profiling resolution on the order of 5 nm (nanometer). According to some embodiments, the vertical profiling resolution may ultimately be finer (i.e. equal to a value smaller than $\max\{v_s \cdot \delta t, \Delta z\}$ when the inspected structure is uniform) due to the joint processing of the acousto-optic measurement data with the scanning electron microscopy measurement data.

The frequency (or, more precisely, the instantaneous frequency peak) of the scattered portion of the probe pulse (i.e. the portion of the probe pulse scattered off the acoustic pulse) is shifted. This so-called "Brillouin frequency shift" depends on the refractive index and speed of sound, or the local refractive index and local speed of sound when the medium is not uniform, as well the frequency (or, equivalently, the wavelength) of the probe pulse. The Brillouin frequency shift is manifested as an oscillating contribution (termed "Brillouin oscillations") to the returned portion of the probe pulse due to interference of the Brillouin scattered portion of the probe pulse with a reflected portion thereof (i.e. a portion of the probe pulse reflected off the inspected structure, from the top surface thereof, and, when including layers differing in refractive index, also off the boundaries between adjacent layers). The frequency of the Brillouin oscillations is equal to the Brillouin frequency shift. The k-th acousto-optic measurement signal may include a (k) contribution characterized by an amplitude $A_k$ and a "Brillouin frequency" $f_B^{(k)}$, which is equal to Brillouin frequency shift (by which of the frequency of the Brillouin scattered portions of the probe pulses is shifted).

According to some embodiments, in suboperation 310a3, each of the K acousto-optic measurement signals may be a (temporal) intensity signal $M_k(t)$ obtained by measuring returned pulses associated with the projection of a plurality pump pulse-probe pulse pairs at the same delay of the probe pulse relative to the pump pulse. The acousto-optic key measurement parameters may be derived from the $M_k(t)$. According to some such embodiments, operation 320a may include extracting from each the of $M_k(t)$ an intensity value $S_k$, which quantifies the contribution of the returned portions of the probe pulses—generated in the k-th implementation of operation 310a—to the $M_k(t)$. Some ways whereby the extraction may be realized, according to some embodiments, are described below in the description of the computerized system of FIG. 7.

According to some embodiments, operation 320a may include a sub operation, wherein the $S_k$ are piecewise "stitched", or otherwise interpolated, to obtain a (single) combined signal, which is a function of the time delay $\Delta t$ of the probe pulse relative to the respective pump pulse. According to some such embodiments, the acousto-optic key measurement parameters are derived from the combined signal, which is designated as $S(\Delta t)$.

According to some embodiments, the acousto-optic key measurement parameters may include, or be constituted by, the Brillouin frequencies $f_B^{(k)}$ and, optionally, the amplitudes $A_k$. The $f_B^{(k)}$ and the $A_k$ may be obtained from the (set of the) $S_k$, or, according to some embodiments, from the combined signal $S(\Delta t)$.

Each of the returned pulses typically includes—in addition to a returned portion of the respective probe pulse—a contribution of a returned (reflected and/or scattered) portion of the respective pump pulse. Background signals and/or noise may also be present. According to some embodiments, suboperation 310a3 may include optically filtering the returned pulse so as to attenuate the returned portion of the pump pulse relative to the returned portion of the probe pulse and/or attenuate background signals and/or noise.

It is noted that each of the K returned portions of the (pulsed) probe beams (also referred to as "probe contributions") may include contributions not only due to the elasto-optic effect but also the thermo-optic effect, and, optionally, other contributions, corresponding to deviations from a respective baseline signal, which would be obtained in the absence of the respective (pulsed) pump beams (i.e. were each of the probe beams to be projected on the inspected structure without prior projection of the respective pump beam).

More specifically, according to some embodiments, the production of the acoustic pulse in an inspected structure (due to the expansion of an absorbing region) may be accompanied by a change in the refractive index of the inspected structure (or a part thereof) that is due to the thermo-optic effect—i.e. the change in the refractive index of a medium due to a change(s) in temperature in the medium. According to some embodiments, operation 320a may include a sub operation wherein a thermo-optic contribution to the combined signal S(Δt) may be removed or substantially removed. In particular, according to some embodiments, the thermo-optic contribution may manifest itself as an added slowly varying decaying contribution to the combined signal S(Δt). That is, in such embodiments, the Brillouin frequency is much greater than the frequency associated with the contribution of the thermo-optic effect to the combined signal. Thus, the thermo-optic contribution to the combined signal S(Δt) may be removed, for example, by smoothing S(Δt) (that is, by averaging over short segments of S(Δt), such that each segment includes a small number of (Brillouin) oscillations). Alternatively, according to some embodiments, S(Δt) may be fitted to a function (e.g. a decaying exponential function or a decaying polynomial function), which models the decay of the thermo-optic contribution, The fitted signal is then subtracted from S(Δt). The removal of the thermo-optic contribution may be especially pertinent when the inspected structure is a silicon-based semiconductor, since in silicon-based semiconductors the thermo-optic effect may be much stronger than the elasto-optic effect.

According to some embodiments, the acousto-optic key measurement parameters may be constituted by S*(Δt), wherein S*(Δt) is the signal obtained by removing the thermo-optic contribution to S(Δt).

According to some embodiments, as part of the extraction of the acousto-optic measurement parameters, each of the $\Delta t_k$ may be related to the respective depth $\Delta z_k$ at which the inspected structure was probed by the respective probe pulses (or, equivalently, the pulsed probe beam including these probe pulses). Put differently, a function g(Δt) may be derived, which given a time delay Δt outputs the depth Δz at which the inspected structure was probed by these probe pulses (i.e. Δz=g(Δt)). According to some embodiments, g(Δt) may be derived using machine-learning tools. In such embodiments, the acousto-optic key measurement parameters may be constituted by the composite function $B = S^* \circ g^{-1}$, $g^{-1}$ is the inverse of g and ∘ denotes function composition. That is, $B(\Delta z) = S^*(g^{-1}(\Delta z))$.

In operation 330, the acousto-optic extracted values (e.g. the Brillouin frequencies $f_B^{(k)}$, the amplitudes $A_k$, and, more generally, the $S_k$, or the combined signal S(Δt), optionally, after the removal of the thermo-optic contribution thereto) and the scanning electron-microscopy extracted values, are input into a machine-learning algorithm. (Non-limiting examples of scanning electron microscopy key measurement parameters in the case that the inspected structure is a V-NAND, or a similarly shaped structure, are listed in the description of FIGS. 5A and 5B below.) The machine-learning algorithm is configured to output estimates of one or more structural parameters of the inspected structure (i.e. parameters indicative of a three-dimensional geometry and/or a material composition of the inspected structure). As a non-limiting example, according to some embodiments, wherein the inspected structure is a V-NAND, method 300 may be used to characterize the geometry of each via, particularly, the dimensions of the opening thereof, the bottom surface thereof, the depth thereof, and a slanting thereof (i.e. the tilt angle of the via, when not fully upright), as well as, optionally, distances between vias and/or widths of silicon layers constituting a bulk of the V-NAND. According to some embodiments, method 300 may be used to characterize the dimensions of the lateral cross-section of a via as a function of the depth within the via.

According to some embodiments, method 300 may be used to profile a known type of structure (e.g. a V-NAND, a DRAM, a FinFET) whose design intent (e.g. an intended geometry of the vias, when the structure is V-NAND, or the pitch characterizing the fins in a FinFET) is not known or partially known.

According to some embodiments, method 300 may be used to estimate deviations from design intent. According to some such embodiments, the machine-learning algorithm may be configured to take into account design data of the inspected structure.

According to some embodiments, operation 310a may be implemented a plurality of times. Each implementation may involve different respective preparations of the pump pulses and/or the probe pulses. The number of different time delays and the values thereof may or may not be varied from one implementation to the next. As non-limiting example, according to some embodiments, operation 310a may be performed (at least once) with the probe pulses polarized in parallel to the x-axis, and (at least once) with the probe pulses polarized in parallel to the y-axis.

Figure 4B:
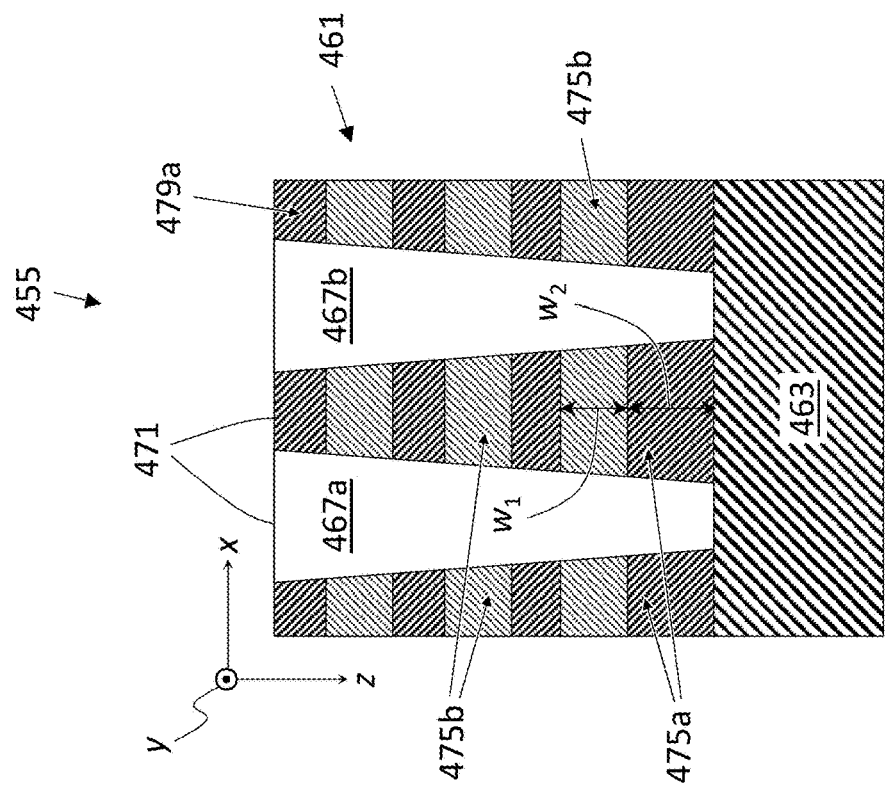
FIGS. 4A-4G present stages in profiling of a V-NAND-like structure in accordance with the method of FIG. 3, according to some embodiments thereof.
Figure 4A:
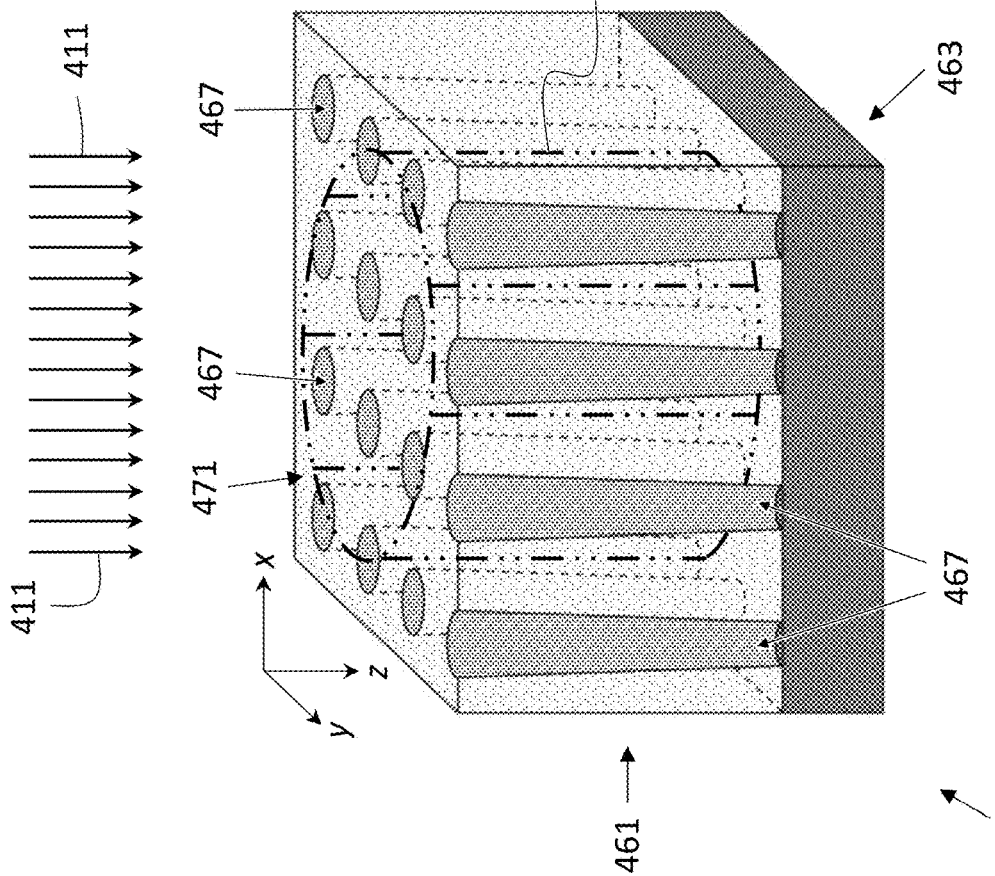
Figures 4C, 4D:
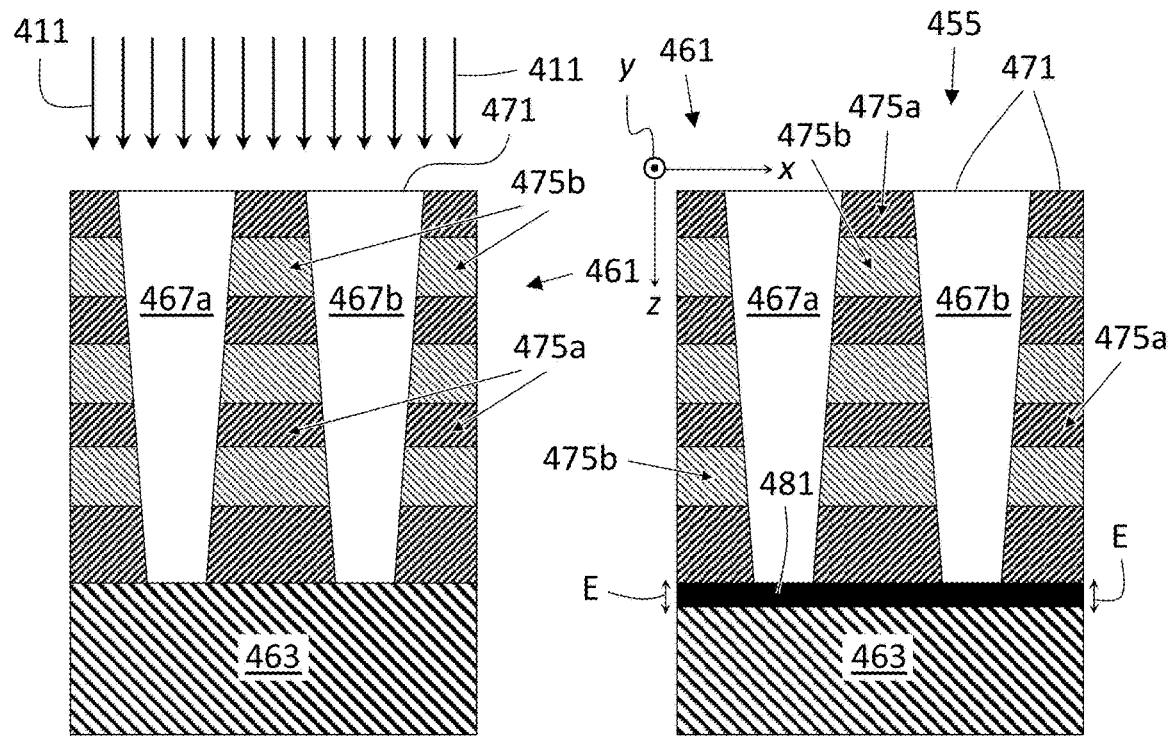
Figures 4E, 4F:
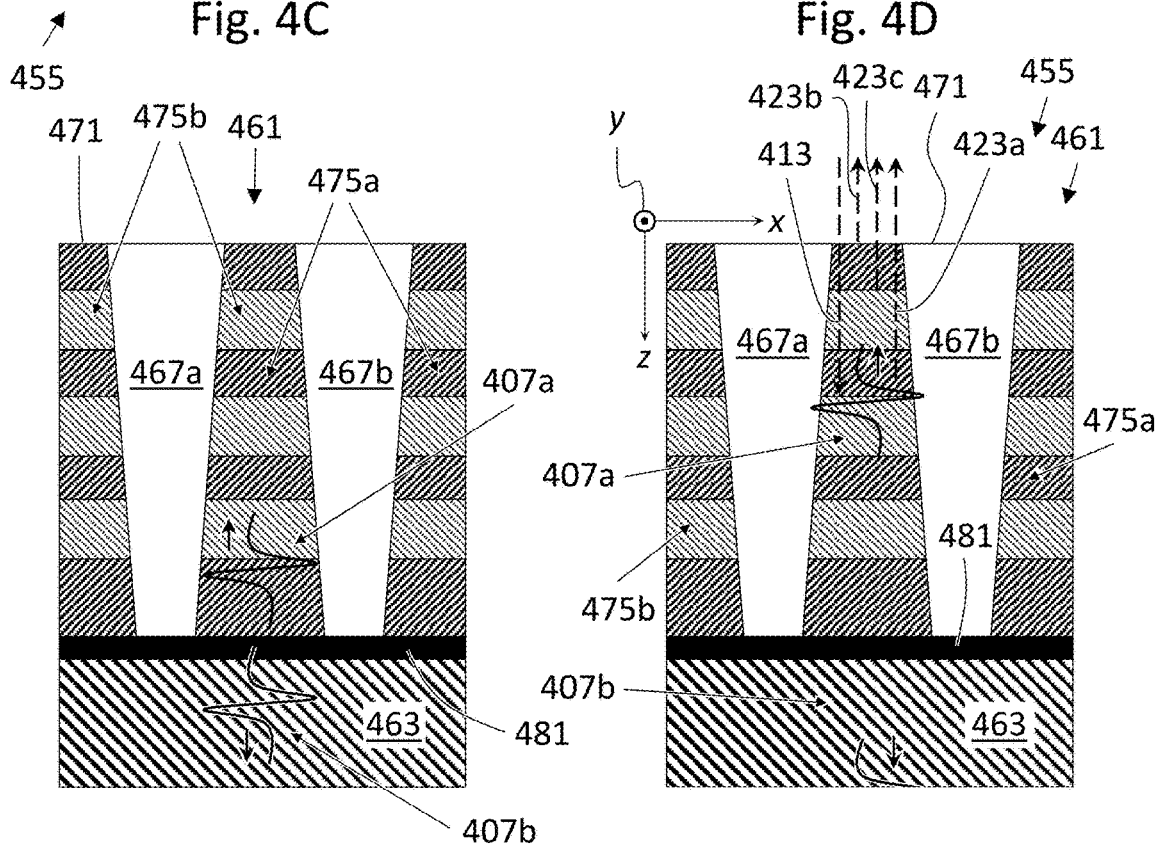
Figure 4G:
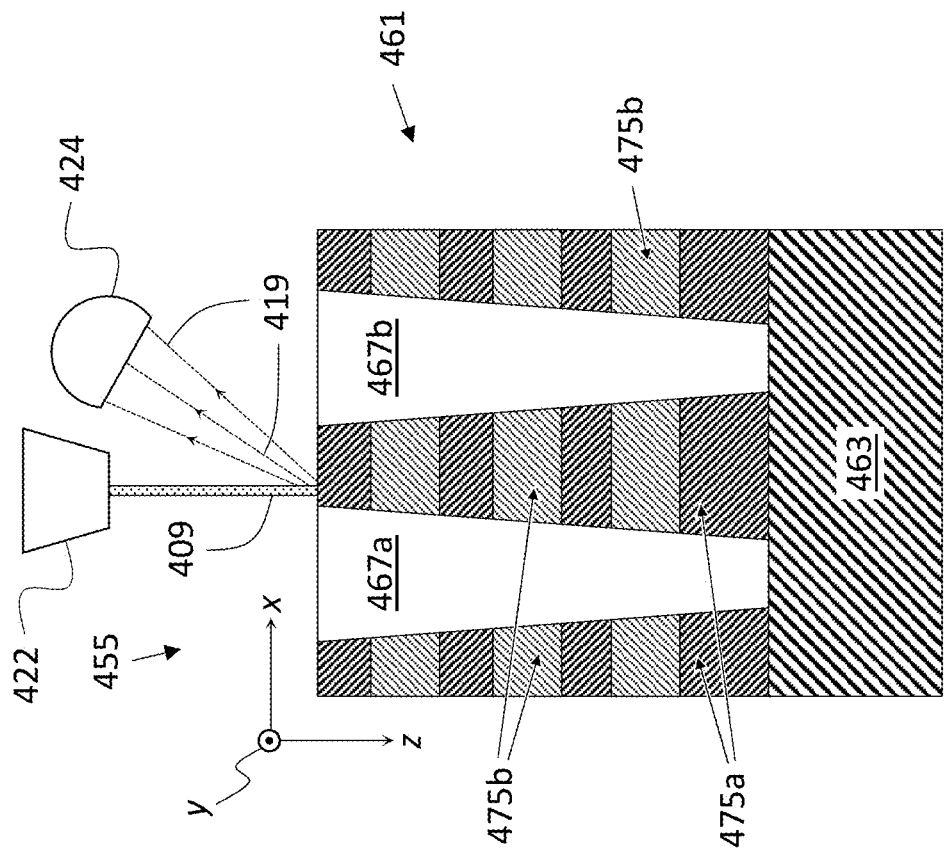

Referring also to FIGS. 4A-4G, as a non-limiting example, intended to facilitate the description by rendering it more concrete, depicted are different stages in an implementation of method 300, according to some specific embodiments thereof. More specifically, FIGS. 4C-4F depict stages in probing of an (inspected) structure 455 in accordance with operation 310a of method 300, according to some embodiments thereof. FIG. 4G depicts probing of structure 455 in accordance with operation 310b of method 300, according to some embodiments thereof.

Referring to FIG. 4A, structure 455 is shown with a front part thereof removed to better reveal the internal structure thereof. Structure 455 may form part of, or be positioned on, a sample, such as a patterned wafer. Structure 455 includes an upper part 461 and a base 463 (e.g. a bulk of structure 455). Upper part 461 includes vias (empty holes) 467 projecting into upper part 461 from a top (as depicted in FIG. 4A) surface 471 of upper part 461. Upper part 461 may be characterized by one or more refractive indices and base 463 may be characterized a refractive index, which differs from the one or more refractive indices. As a non-limiting example, according to some embodiments, upper part 461 may be characterized by two refractive indices corresponding to two sets of layers, respectively. The two sets of layers are distinguished in FIGS. 4B-4G.

To facilitate the description, as a non-limiting example, in the following, each of vias 467 is assumed to nominally project longitudinally (and vertically) into upper part 461 and to be characterized by a circular lateral cross-section whose area decreases with the depth. According to some embodiments, and as depicted in FIG. 4A, vias 467 are arranged in a periodic two-dimensional array. According to some such embodiments, the two-dimensional array is rectangular with vias 467 being arranged in rows and columns parallel to x-axis and y-axis, respectively.

FIG. 4B presents a (partial) cross-sectional view of structure 455, according to some embodiments. The cross-section cuts structure 455 along a plane, which is parallel to the zx-plane. According to some embodiments, and as depicted in FIGS. 4B-4G, structure 455 may be a layered structure including a plurality of layers 475 stacked on top of one another. (Layers 475 are not distinguished from one another in FIG. 4A.) According to some embodiments, layers 475 may include two types of layers: first layers 475a and second layers 475b are alternately positioned one on top of the other. First layers 475a and second layers 475b may be made of different materials. According to some embodiments, structure 455 may be a V-NAND (i.e. vertical-NAND) stack, wherein upper part 461 (which includes layer 475) is mounted on a silicon substrate constituted by base 463. As a non-limiting example, according to some such embodiments, first layers 475a (including the outermost layer) may be made of silicon oxide ($SiO_2$) and second layers 475b may be made of a silicon nitride (e.g. $Si_3N_4$).

FIGS. 4C-4F schematically depict four successive stages, respectively, in probing of a (probed) portion 479 (shown in FIG. 4A and delineated by a dashed-double-dotted line) of structure 455, according to method 300. Referring to FIG. 4C, a pump pulse 411 is shown projected on top surface 471, according to some embodiments. Pump pulse 411 is configured to penetrate into upper part 461 and propagate therein to reach base 463. Pump pulse 411 is further configured to be absorbed by base 463. Pump pulse 411 is also indicated in FIG. 4A.

Referring to FIG. 4D, pump pulse 411 is absorbed in an absorption region 481 (which forms part of base 463) positioned adjacently to upper part 461. A thickness of absorption region 481 depends on the absorption length of pump pulse 411 in base 463. The heating of absorption region 481 leads to an expansion thereof, as indicated by double-headed arrows E in FIG. 4D.

Referring to FIG. 4E, the expansion of absorption region 481 leads to the formation of a (first) acoustic pulse 407a propagating within upper part 461 in the direction of the negative z-axis. A second acoustic pulse 407b may propagate within base 463 in the direction of the positive z-axis. As acoustic pulse 407a propagates within upper part 461, acoustic pulse 407a temporarily locally modifies the density distribution across the segment whereat the acoustic pulse is momentarily localized. This in turn leads to a temporary modification of the refractive index due to the elasto-optic effect.

Referring to FIG. 4F, a probe pulse 413 is shown projected on top surface 471, according to some embodiments. Probe pulse 413 is configured to penetrate into upper part 461 and propagate therein in the direction of the positive z-axis. That is, probe pulse 413 is configured such that upper part 461—at least when undisturbed—may be transparent, or at least semi-transparent, with respect to probe pulse 413. The localized presence of acoustic pulse 407a, in a localized subregion within upper part 461, modifies the optical properties of the subregion. Consequently, when probe pulse 413 (or, more precisely, a portion thereof transmitted into upper part 461 and not reflected from the boundaries between adjacent layers from first layers 475a and second layers 475b) arrives at the localized subregion, wherein acoustic pulse 407a is present, a portion thereof undergoes Brillouin scattering off acoustic pulse 407a. A (Brillouin) scattered portion 423a of probe pulse 413 propagates away from acoustic pulse 407a in the direction of the negative z-axis. From optical diffraction limit considerations, according to some embodiments, a wavelength of probe pulse 413 may be at least about two times greater than the diameter of vias 467 and/or a distance between adjacent vias (from vias 467, such a first via 467a and a second via 467b). According to some embodiments, structure 455 is a V-NAND with adjacent vias being separated by a distance of either about 50 nm, about 100 nm, or about 200 nm, the wavelength of probe pulse 413 may be at least about 100 nm, at least about 200 nm, or at least about 400 nm, respectively. Each possibility corresponds to separate embodiments.

Also indicated in FIG. 4F is a reflected portion 423b of probe pulse 413, which is reflected off top surface 471, and a reflected portion 423c of probe pulse 413, which is reflected off the boundary between the top layer of first layers 475a and the top layer of second layers 475b.

It is noted that the depth inside structure 455 at which probe pulse 413 is scattered off acoustic pulse 407a depends on the time delay by which probe pulse 413 is delayed relative to pump pulse 411. More specifically, the depth u (i.e. the vertical distance) at which probe pulse 413 is scattered off acoustic pulse 407a may be related to the time delay via $\Delta t_k \approx \tau_F + \Sigma_{i=1}^{k-1}(w_i/v_i) + (u_{max} - u - \Sigma_{i=1}^{k-1} w_i)/v_i$. The are the (vertical) widths of layers 475. The most bottom of layers 475 is indexed as 1 (and has the width $w_1$, indicated in FIG. 4B), the second most bottom of layers 475 is indexed as 2 (and has the width $w_2$, indicated in FIG. 4B), and so on. $u_{max}$ is the depth of vias 467, or equivalently, the distance from top surface 471 to the boundary between upper part 461 and base 463. (Generally, z=u+a, wherein a is a constant. If the coordinate system is selected such that the xy-plane coincides with top surface 471, then a=0 and z=u.) $v_i$ designates the speed of sound in the i-th bottommost of layers 475. (It is noted that in FIGS. 4B-4G, the speed of sound in upper part 461 alternates (as the depth is increased) between two values since upper part 461 is composed of two types of layers.) Generally, when the velocity of sound varies continuously with the depth, the above equation is substituted by integral equation.

Referring again to FIG. 4A, probed portion 479 is shaped as a cylinder, whose diameter is defined by a beam diameter of probe pulse 413. According to some embodiments, in order to fully probe probed portion 479, a beam diameter of pump pulse 411 may be selected to be greater than, or at least about equal to, the diameter of probe pulse 413. According to some embodiments, and as depicted in FIG. 4A, probed portion 479 includes a plurality of vias from vias 467.

According to some embodiments, a plurality of probed portions (such as probed portion 479) may be probed one after another in order to fully probe an inspected structure. According to some embodiments, measurement data of each probed portion may be processed alone, so that the obtained one or more structural parameters pertain solely to the probed portion. Alternatively, according to some embodiments, measurement data from a plurality of probed portions, e.g. adjacent probed portions, may be jointly processed. According to some such embodiments, some or all of the key measurement parameters may be derived taking into account the measurement data from all of the probed portions in a plurality. In some such embodiments (i.e. wherein measurement data from a plurality of probed portions is jointly processed), the obtained one or more structural parameters may correspond to "averages" over the structural parameters pertaining to each of the probed portions in the plurality.

While in FIGS. 4A-4G the diameter of vias 467 is depicted as decreasing substantially linearly with the depth, the skilled person readily perceive that the methods and systems of the present disclosure may be applied to probe other via geometries, such as, for example, straight (circular) via geometries (i.e. via geometries wherein the diameter is constant), or circular via geometries wherein the change (with the increase in depth) of the via diameter is non-monotonic (e.g. increasing first and then decreasing).

According to some embodiments, wherein vias 467 are arranged in a two-dimensional array, probe pulse 413 may be linearly polarized along a direction perpendicular to the z-axis. More specifically, according to some embodiments, wherein vias 467 are arranged in a rectangular array as described above, in order to increase measurement sensitivity along the y-axis, probe pulse 413 may be polarized in parallel to the x-axis. Similarly, in order to increase measurement sensitivity along the x-axis, probe pulse 413 may be polarized in parallel to the y-axis. Polarizing a probe pulse in parallel the x-axis may lead to a non-uniform intensity distribution of the probe pulse within the probed portion, wherein the intensity is maximum along columns of vias. In contrast, polarizing a probe pulse in parallel the y-axis may lead to a non-uniform intensity distribution of the probe pulse within the probed portion, wherein the intensity is maximum along rows of vias.

Referring to FIG. 4G, an e-beam source 422 is shown probing structure 455, according to some embodiments. An e-beam 409, produced by e-beam source 422, is shown projected on structure 455. Secondary and/or backscattered electrons, which are returned in the direction of an electron sensor 424, as indicated by arrows 419, are sensed by electron sensor 424, thus obtaining scanning electron microscopy measurement data of structure 455. According to some embodiments, the scanning electron microscopy measurement data may further include one or more of X-ray signals, and/or cathodoluminescent light signals, measured by the one or more optical sensors (not shown), and/or an absorbed current signal measured by the electric current sensor (not shown).

According to some embodiments, structure 455 may be scanned by a plurality e-beams, which differ in the landing energies thereof and/or the intensities thereof.

Figure 5A:
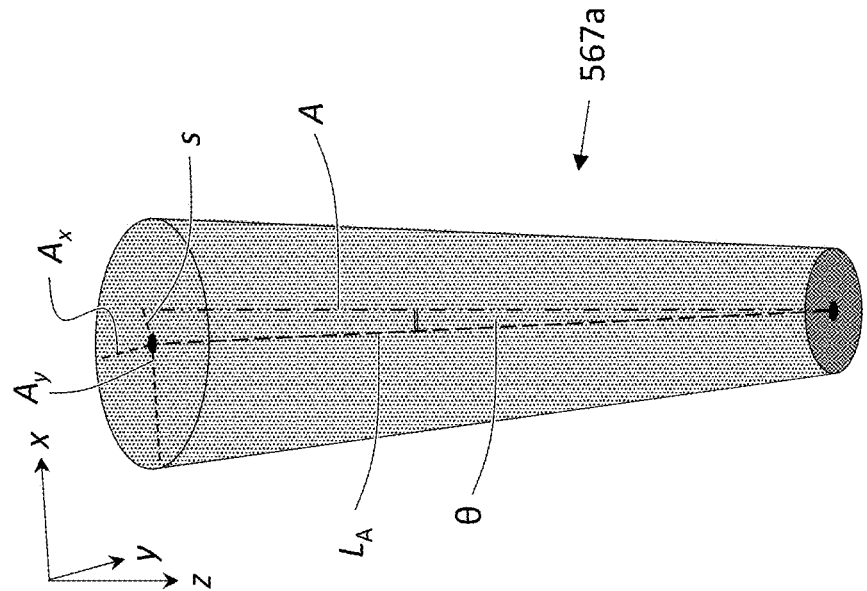
FIGS. 5A and 5B indicate lateral geometrical features, which may be extracted from scanning electron microscopy measurement data of a V-NAND-like shaped structure, according to some embodiments.
Figure 5B:
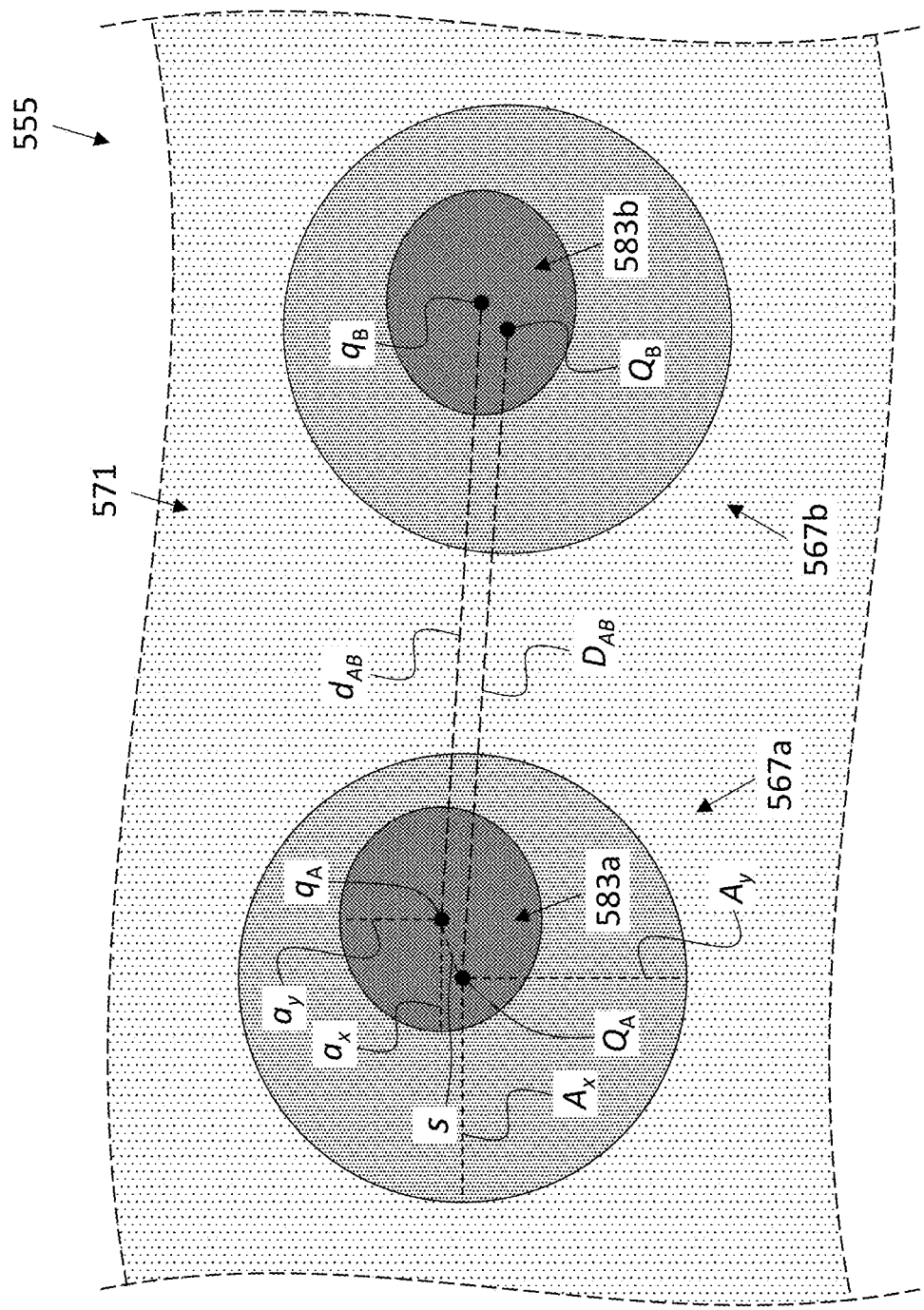

Various key measurement parameters extractable from scanning electron microscopy measurement data of a V-NAND, or similarly shaped structure, according to some embodiments are listed below. According to some embodiments, wherein from the scanning electron microscopy measurement data a SEM image is generated, some or all of the scanning electron microscopy key measurement parameters may correspond to geometrical features, particularly lateral geometrical features, of the inspected structure, as illustrated in FIGS. 5A and 5B. Non-geometrical scanning electron microscopy key measurement parameters (derivable from the scanning electron microscopy measurement data) may include, for example, features of obtained signals, such as contrast levels in a SEM image, and the standard deviation of the noise at bright/dim areas in the SEM image.

FIG. 5A provides a perspective view of a (first) via 567a, according to some embodiments. FIG. 5B provides a top view of a part of an (inspected) structure 555, according to some embodiments. According to some embodiments, structure 555 may be similar to structure 455, i.e. structure 555 may be a V-NAND or a similarly shaped structure. Shown are a top surface 571 of structure 555, first via 567a, and a second via 567b, which is adjacent to first via 567a, according to some embodiments. First via 567a and second via 567b may constitute adjacent vias on a same row of vias in structure 555. Also shown are a bottom surface 583a of first via 567a and a bottom surface 583b of second via 567b.

As a non-limiting example, intended to facilitate the description by rendering it more concrete, geometries of first via 567a and second via 567b are assumed to deviate from intended design. Accordingly, first via 567a and second via 567b are assumed to have elliptical (rather than perfectly circular) lateral cross-sections, which decrease in area as the depth (or, equivalently, the z-coordinate) is increased. Further, both first via 567a and second via 567b are assumed to be tilted, as evinced by a center $q_A$ of bottom surface 583a being laterally displaced relative to a center $Q_A$ of the ellipse defined by the opening of first via 567a, and as evinced by a center $q_B$ of bottom surface 583b being laterally displaced relative to a center $Q_B$ of the ellipse defined by the opening of second via 567b. An angle θ by which a longitudinal axis $L_A$ of first via 567a is tilted relative to the (positive) z-axis is indicated in FIG. 5A.

Further indicated in FIG. 5B are semi-axes $A_x$ and $A_y$ of the ellipse defined by the opening of first via 567a, and semi-axes $a_x$ and $a_y$ of the ellipse defined by bottom surface 583a. A line $D_{AB}$, extending from $Q_A$ to $Q_B$, indicates the distance between the centers of the via openings of first via 567a and second via 567b. A line $d_{AB}$, extending from $q_A$ to $q_B$, indicates the distance between the centers of bottom surfaces 583a and 583b. A line s indicates the lateral distance between $Q_A$ and $q_A$.

According to some embodiments, key measurement parameters in the second set, pertaining to a via, may correspond to, or be derived from, one or more lateral geometrical features of the via, such as the area of the via opening, the area of the bottom surface of the via, (when the lateral cross-section of the via are is substantially elliptical) the (lateral) measurements and orientations of the semi-axes of the ellipses defined by the via opening and the bottom surface, and the lateral displacement of the center of the bottom surface relative to the center of the via opening. Key measurement parameters in the second set may also correspond to, or may be derived from, one or more lateral geometrical features pertaining to pairs of vias, such as the lateral distance (optionally, specifying the projections onto each of the x and y axes) between the centers of the via openings of a pair of vias, and the lateral distance (optionally, specifying the projections onto each of the x and y axes) between the centers of the bottom surfaces of the pair.

It is noted that lateral geometrical features of an inspected structure, such as the lateral dimensions of vias of structure 555 and the distances therebetween—which may be estimated solely based on SEM images—using the methods and systems of the present disclosure, may advantageously be estimated to greater accuracy by further taking into account acousto-optic measurement data of the inspected structure and joint processing thereof (or, more precisely, the key measurement parameters extracted therefrom) with the SEM image(s) (or, more precisely, the key measurement parameters extracted therefrom) of the inspected structure. Further, the tilt angle of a via (e.g. the angle θ in FIG. 5A) may be estimated by jointly processing the acousto-optic measurement data (or, more precisely, the key measurement parameters extracted therefrom) and SEM images (or, more precisely, the key measurement parameters extracted therefrom) of the inspected structure.

Systems

According to an aspect of some embodiments, there is provided a computerized system for non-destructive hybrid acousto-optic and scanning electron microscopy based metrology. FIG. 6 presents a block diagram of such a computerized system, a computerized system 600, according to some embodiments. A sample 651 includes (as depicted in FIG. 6, mounted thereon) an (inspected) structure 655. Structure 655 is shown undergoing inspection by system 600. It is to be understood that sample 651 and structure 655 do not form part of system 600. According to some embodiments, sample 651 may be a semiconductor device such as a patterned wafer.

System 600 includes a measurement setup 602 and a computational module 604. Measurement setup 602 includes an acousto-optic setup (not numbered) and a scanning electron microscope (SEM) 608. Measurement setup 602 may further include a controller 610 functionally associated with components of measurement setup 602 and/or communicatively associated with computational module 604, as indicated by dotted lines F. The acousto-optic setup includes light generating equipment 612 and a light detector 614. SEM 608 includes an electron beam (e-beam) source 622 and SEM sensor(s) 624.

Light generating equipment 612 is configured to produce an (optical) pump beam (represented by a first arrow $A_1$) directed on structure 655. The pump beam is configured to be absorbed by sample 651 so as to cause an acoustic disturbance (at least) in structure 655. Light generating equipment 612 is further configured to project on structure 655 an (optical) probe beam (represented by a second arrow $A_2$), while the acoustic disturbance in structure 655 is ongoing (i.e. still occurring). The optical probe beam is configured to penetrate into structure 655.

Light detector 614 is configured to sense light returned from structure 655 (the returned light is represented by a third arrow $A_3$). According to some embodiments, light detector 614 may be configured to measure the intensity of the returned light. According to some embodiments, light detector 614 may be a fast optical detector. According to some embodiments, light detector 614 may be configured to measure the intensity of the returned light over a time interval, thereby obtaining a temporal dependence of the intensity of the returned light. Additionally, or alternatively, according to some embodiments, light detector 614 may be configured to directly measure (e.g. when light detector 614 is or includes a spectrometer) the spectrum of the returned light.

Measurement data (represented by a fourth arrow $A_4$), obtained by light detector 614, are relayed to computational module 604 (either directly or via controller 610).

E-beam source 622 is configured to produce an e-beam (represented by a fifth arrow $A_5$) directed at structure 655, and which may be scanned thereon.

SEM sensor(s) 624 are configured to measure one or more signals (represented by a sixth arrow $A_6$) produced as a result of the scanning of structure 655 by the e-beam. According to some embodiments, SEM sensor(s) 624 include one or more electron sensors (not shown) configured to sense secondary electrons and/or backscattered electrons, which may be generated when structure 655 is impinged by an e-beam. Additional elements of SEM 608, such as an electrostatic lens(es) and a magnetic deflector(s), which may be used to guide and manipulate the e-beam, are not shown. Additionally, or alternatively, to the one or more electron sensors, SEM sensor(s) 624 may include one or more optical sensors (not shown) configured to sense X-ray radiation and/or cathodoluminescent light, which may be generated when structure 655 is impinged by an e-beam, and/or an electrical sensor (not shown) configured to measure an absorbed current signal, which may be generated when structure 655 is impinged on by an e-beam.

Scanning electron microscopy measurement data (represented by a fourth arrow $A_7$), obtained by SEM sensor(s) 624, are relayed to computational module 604 (either directly or via controller 610).

Computational module 604 is configured to process the acousto-optic measurement data and the scanning electron microscopy measurement data to obtain information indicative of a three-dimensional geometry and/or a material composition of structure 655, as described below.

According to some embodiments, light generating equipment 612 may include a light source (not shown) configured to generate both the pump beam(s) and the probe beam(s). Alternatively, according to some embodiments, light generating equipment 612 may include two light sources: a first light source configured to generate the pump beam(s) and a second light source configured to generate the probe beam(s).

According to some embodiments, light generating equipment 612 may be configured to generate pulsed light beams (e.g. pulsed laser beams) and/or continuous-wave light beams (e.g. continuous-wave laser beams). That is, the pump beam(s) may be continuous-wave or pulsed and the probe beam(s) may be continuous-wave or pulsed. Each of the possibilities corresponds to separate embodiments.

According to some embodiments, light generating equipment 612 may be configured to allow controllably setting and adjusting the waveforms of a produced pump beam and/or a produced probe beam. According to some embodiments, light generating equipment 612 may be configured to allow controllably setting a polarization of a produced pump beam and/or a polarization of a produced probe beam. According to some such embodiments, light generating equipment 612 may include one or more polarizers (not shown). Further, light generating equipment 612 may be configured to allow controllably setting the intensity of the pump beam and the intensity of the probe beam and/or the beam diameters thereof.

Controller 610 may be configured to control and synchronize operations of the various components of measurement setup 602. In particular, controller 610 may be configured to allow setting the values of selectable preparation parameters of the pump beam and the probe beam (e.g. the waveforms, polarizations, intensities of each the pump beam(s) and the probe beam(s), and/or incidence angles thereof, and according to some embodiments, a time delay between successive pump and probe pulses), as well as the e-beam (e.g. the (average) landing energy of electrons in the e-beam(s), and/or the intensity of the e-beam(s)). Further, controller 610 may be configured to allow setting operational parameters of light detector 614 and/or SEM sensor(s) 624. (It is noted that the term "operational parameters" is used herein broadly and covers not only preparation parameters but may also specify types of setup settings including, for example, numbers of detector and/or sensors used). For example, according to some embodiments, both the spectral range and the bandwidth of the output signal of light detector 614 may be adjusted by controller 610. According to some embodiments, wherein the acousto-optic setup includes a polarization filter (not shown), which is functionally associated with controller 610 and which configured to transmit therethrough only returned light of a certain polarization, the polarization (e.g. vertical, horizontal, right-handed circular, or left-handed circular) may be selectable by controller 610. Further, according to some embodiments, the gain, the bandwidth (of the output signal), and/or the collection angle of SEM sensor(s) 624 may be set by controller 610. According to some embodiments, SEM sensor(s) 624 may be or include an electron sensor configured to sense secondary electrons. According to some embodiments, SEM sensor(s) 624 may be or include an electron sensor configured to sense backscattered electrons.

According to some embodiments, controller 610 may be configured to send to computational module 604 information regarding operational parameters of measurement setup 602, particularly parameters characterizing the pump beam(s) and/or the probe beam(s), such as waveforms, polarizations, intensities, incidence angles thereof, and beam widths—and, according to some embodiments, a time delay there between—and parameters characterizing the e-beams, such as the landing energies of electrons in the e-beams, intensities, beam widths, and intended striking locations of the e-beams on the inspected structure.

Analog-to-digital converters (ADCs), which are configured to convert into digital signals analog signals, sensed by light detector 614 and/or SEM sensor(s) 624, are not shown. According to some embodiments, light detector 614 may be equipped with a respective ADC and SEM sensor(s) 624 may be equipped with a respective ADC(s). Additionally, or alternatively, to this end, according to some embodiments, controller 610 and/or computational module 604 may include one or more ADCs.

Computational module 604 includes computer hardware (one or more processors, and volatile as well as non-volatile memory components; not shown). The computer hardware is configured to run software, stored thereon or remotely, which is configured to output estimates one or more structural parameters of structure 655, based at least on the acousto-optic measurement data, relayed from light detector 614, and the scanning electron microscopy data relayed from SEM sensor(s) 624. The one or more structural parameters may be indicative at least of a three-dimensional geometry of structure 655. According to some embodiments, the one or more structural parameters may further be indicative of a material composition of structure 655. To estimate the one or more structural parameters of structure 655, according to some embodiments, the computer hardware may be configured to execute an algorithm(s) (e.g. a ML-derived algorithm such as a deep neural network), as described above in the description of operation 130 of method 100 and operation 230 of method 200.

According to some embodiments, the computer hardware may further be configured to, prior to executing the ML-derived algorithm(s), run software (e.g. signal and/or image processing software), stored thereon or remotely, which is configured to extract values of acousto-optic key measurement parameters and scanning electron microscopy key measurement parameters from the acousto-optic measurement data and scanning electron microscopy measurement data, as described above in the description of operation 120 of method 100 and operations 220a and 220b of method 200.

It is noted that the extraction of the key measurement parameters may involve use of algorithms configured to enhance measurement signals and/or obtained images (e.g. SEM images). According to some embodiments, computational module 604 may be configured to process the acousto-optic measurement data into a spectrogram and/or suppress laser noise based on noise correlations between the pump pulse and probe pulse. Further, as elaborated on above in the description of method 300, a fitting algorithm may be used to remove, or at least attenuate, a thermo-optic contribution to signals measured by light detector 614. Alternatively, low-pass filtering may be employed to average out the thermo-optic contribution. Examples of SEM image processing algorithms include noise reduction algorithms, for example, based on spatial, temporal, and/or bilateral filtering. Additional examples of SEM image processing algorithms include detection of shapes and/or patterns in the SEM image (e.g. circle detection, using a Hough transform, in embodiments wherein the inspected structure includes vias).

According to some embodiments, and as described above in the description of method 100, parameters of the ML-derived algorithm(s) may depend on the operational parameters of measurement setup 602. Additionally, or alternatively, according to some embodiments, the choice of key measurement parameters may depend on the operational parameters of the measurement setup.

According to some embodiments, computational module 604 and controller 610 may be housed in a common housing, for example, when implemented by a single computer.

Figure 7:
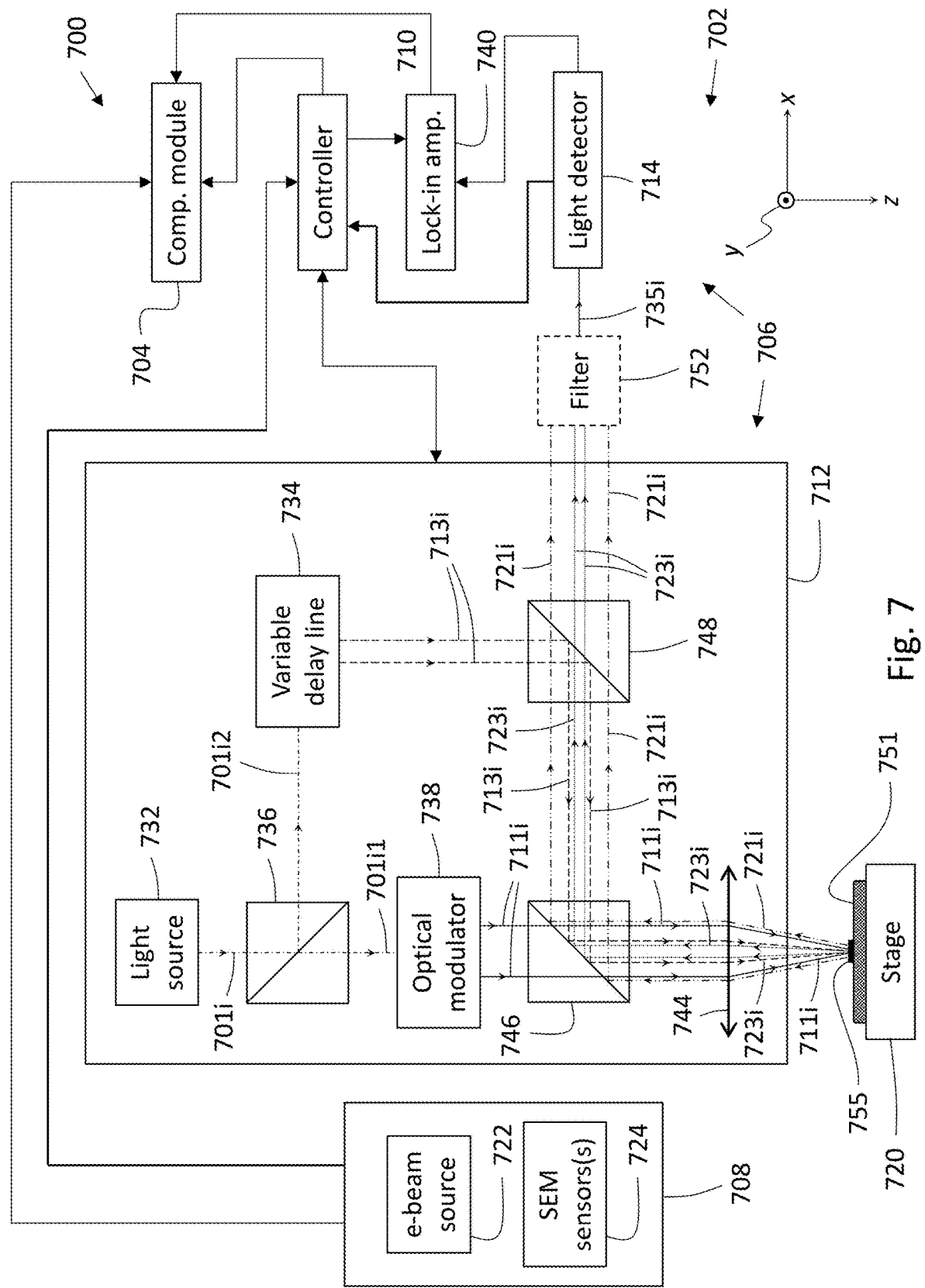
FIG. 7 presents a computerized system for non-destructive hybrid acousto-optic and scanning electron microscopy based metrology, which corresponds to specific embodiments of the method of FIG. 6.

FIG. 7 schematically depicts a computerized system 700, which corresponds to specific embodiments of system 600. System 700 includes a measurement setup 702 and a computational module 704, which correspond to specific embodiments of measurement setup 602 and computational module 604, respectively. Also depicted is a sample 751 including an (inspected) structure 755. Sample 751 and structure 755 correspond to specific embodiments of sample 651 and structure 655, respectively. It is to be understood that sample 751 and structure 755 are not included in system 700. According to some embodiments, and as depicted in FIG. 7, sample 751 may be a patterned wafer. Measurement setup 702 includes an acousto-optic setup 706, a SEM 708, and a controller 710, which correspond to specific embodiments of the acousto-optic setup of measurement setup 602, SEM 608, and controller 610, respectively.

Acousto-optic setup 706 includes light generating equipment 712 and a light detector 714, which correspond to specific embodiments of light generating equipment 612 and light detector 614, respectively. Also indicated is a stage 720 (e.g. a xyz stage) on which sample 751 is placed.

Light generating equipment 712 may include a light source 732 (such as a laser beam source), a variable delay-line 734, and a first beam splitter 736. Light source 732 may be configured to produce a pulsed light beam (i.e. a series of light pulses). Variable delay-line 734 is configured to delay a light pulse transmitted thereinto by a time interval, which may be controllably selected. Optionally, according to some embodiments, and as depicted in FIG. 7, light generating equipment 712 may further include an optical modulator 738. According to some embodiments, and as elaborated on below, optical modulator 738 may be configured to modulate a waveform of a pump pulse transmitted thereinto, as described in detail below. In some such embodiments, system 700 may further include a lock-in amplifier 740, whose function is described below. According to some embodiments, lock-in amplifier 740 may be included in computational module 704.

According to some embodiments, and as depicted in FIG. 7, light generating equipment 712 may further include an objective lens 744, a second beam splitter 746, and a third beam splitter 748. According to some embodiments, and as depicted in FIG. 7, acousto-optic setup 706 may further include an optical filter 752.

SEM 708 includes an e-beam source 722 and SEM sensor(s) 724, which correspond to specific embodiments of e-beam source 622 and SEM sensor(s) 624, respectively.

In FIG. 7, structure 755 is shown undergoing profiling by system 700, according to some embodiments. More specifically, structure 755 is shown being probed by acousto-optic setup 706, according to some embodiments. In operation, light source 732 produces, one at a time, a plurality of pulsed light beams (e.g. a series of pulsed laser beams). To facilitate the description, the operation of acousto-optic setup 706 is described with respect to a single one of the light pulses included in a k-th generated (pulsed) light beam (k=1, 2, 3, . . . , K): an i-th light pulse 701$i$ in the k-th light beam. i-th light pulse 701$i$ is split by beam splitter 736 into two portions: a first (i-th) pulse portion 701$i$1 and a second (i-th) pulse portion 701$i$2. First pulse portion 701$i$1 is transmitted into optical modulator 738, and is modulated thereby, so as to produce an i-th pump pulse 711$i$. Second pulse portion 701$i$2 is transmitted into variable delay-line 734 and is delayed thereby by a time delay $\Delta t_k$, thereby producing i-th probe pulse 713$_i$.

More specifically, the k-th pulsed light beam is used in preparing a k-th pulsed pump beam and a k-th pulsed probe beam with each probe pulse (in the k-th pulsed probe beam) being delayed relative to a corresponding pump pulse (in the k-th pulsed pump beam) by a time delay $\Delta t_k$.

According to some embodiments, optical modulator 738 may be configured so modulate a waveform of each of the first pulse portions, such that each of the respectively resulting pump pulses is characterized by a respective carrier wave and envelope. The envelope may be configured to facilitate the separation of a returned portion of a pulsed probe beam (e.g. the returned portion of the k-th pulsed probe beam, which includes i-th probe pulse 713$i$) from a returned portion of the associated pulsed pump beam (e.g. the returned portion of the k-th pulsed pump beam, which includes i-th pump pulse 711$i$) and/or background signals and noise, thus improving detection. The carrier wave may be configured to facilitate penetration of the pump pulse into the sample. According to some embodiments, and as depicted, for example, in FIGS. 4A-4G, the carrier wave may be configured to facilitate absorption of the pump pulse in a specific region (referred to as "absorption region") of the sample. The absorption region may or may not be included in the inspected structure. According to some embodiments, wherein system 700 includes lock-in amplifier 740, a modulation signal, employed by optical modulator 738 to modulate the first pulse portions, is relayed (e.g. by controller 710) to lock-in amplifier 740.

Each of i-th pump pulse 711$i$ and i-th probe pulse 713$i$ are directed onto structure 755, so as to be incident thereon with i-th probe pulse 713$i$ impinging on structure 755 at a time delay equal to $\Delta t_k$ relative to i-th pump pulse 711$i$. The set of time delays $\{\Delta t_k\}$k includes distinct time intervals. As a non-limiting example, according to some embodiments, $\Delta t_k = \tau_F + (k-1) \cdot \delta t$. According to some embodiments, $\delta t$ may be on the order of 1 psec, so as to allow probing a semiconductor structure at a (spatial) vertical resolution on the order of 5 nm.

According to some embodiments, and as depicted in FIG. 7, prior to impinging on structure 755, i-th pump pulse 711$i$ may be focused by objective lens 744 (optionally, after passage via second beam splitter 746). Similarly, according to some embodiments, and as depicted in FIG. 7, prior to impinging on structure 755, i-th probe pulse 713$i$ may be focused by objective lens 744 (optionally, after passage via third beam splitter 748 and reflection by second beam splitter 746).

A first returned i-th pulse 723$i$ (indicated by dotted lines) corresponds to a portion of i-th probe pulse 713$i$, which is returned from structure 755 (both a reflected portion(s) and a Brillouin scattered portion are included in first returned pulse 723$i$). According to some embodiments, and as depicted in FIG. 7, first returned i-th pulse 723$i$ travels onto filter 752 (optionally, after being refocused by objective lens 744, reflection by second beam splitter 746, and passage via third beam splitter 748). A second returned i-th pulse 721$i$ (indicated by dashed-double dotted lines) may correspond to a portion of i-th pump pulse 711$i$, which is returned from structure 755. According to some embodiments, and as depicted in FIG. 7, second returned i-th pulse 721$i$ travels onto filter 752 (optionally, after being refocused by objective lens 744, reflection by second beam splitter 746, and passage via third beam splitter 748).

An i-th filtered pulse 735$i$ corresponds to the output of filter 752. According to some embodiments, the intensity of i-th filtered pulse 735$i$ is measured by light detector 714. More specifically, according to some embodiments, a k-th (acousto-optic) measurement signal may be obtained by measuring intensities (e.g. averaged over short time intervals) characterizing the filtered pulses in a k-th filtered beam associated with the k-th pulsed pump beam and the k-th pulsed probe beam. According to some embodiments, wherein system 700 includes lock-in amplifier 740, the k-th measurement signal is sent to lock-in amplifier 740. Lock-in amplifier 740 uses the modulation signal to obtain a k-th demodulated signal. As described above in the description of method 300, the demodulated signal may represent deviations from a baseline signal (which would be obtained in the absence of the pump beam), and, as such, may exhibit Brillouin oscillations.

The k-th demodulated signal (extracted by lock-in amplifier 740) is relayed (i.e. sent) to computational module 704. Scanning electron microscopy measurement data, obtained by SEM 708, is also relayed to computational module 704. Computational module 704 is configured to jointly process the K demodulated signals, relayed thereto (and resulting from the projection of each of the prepared pairs of pump-probe pulsed beams) and the scanning electron microscopy measurement data to obtain therefrom one or more structural parameters, which characterize a three-dimensional geometry of structure 755. In particular, according to some embodiments, computational module 704 may be configured to execute a ML-derived algorithms(s), as described above in the description of operation 330 of method 300. According to some embodiments, prior to executing the ML-derived algorithm(s), computational module 704 may be configured to run software (e.g. signal and image processing software), which is configured to extract values of acousto-optic key measurement parameters and scanning electron microscopy key measurement parameters from the acousto-optic measurement data and scanning electron microscopy measurement data, respectively, as described above in the description of operations 320$a$ and 320$b$ of method 300. Further, according to some embodiments, computational module 704 may be configured to remove a thermos-optic contribution to the demodulated signals, as described above in the description of operation method 300.

According to some embodiments, and as exemplified in detail for a V-NAND, or a similarly shaped structure (e.g. a DRAM), in the description of FIGS. 4A-4G, the probe beams are configured to penetrate into structure 755, so as to probe structure 755 at different depths. For example, a first pulsed probe beam, whose probe pulses are each delayed at a first time delay $\Delta t_j$ (i.e. relative to the respective pump pulses in the corresponding pulsed pump beam), may probe structure 755 at a depth $u_j$, and a second probe beam, whose probe pulses are each delayed at a second time delay $\Delta t_k$ (with $k \neq j$), may probe structure 755 at a second depth $u_k \neq u_j$.

According to some embodiments, optical modulator 738 may include a frequency doubler (not shown), which is used to modulate the waveform of the light pulses transmitted thereinto (e.g. first pulse portion 701$i$1).

As used herein, according to some embodiments, the term "beam" with reference to a light beam, such as a laser beam, may refer to a continuous-wave light beam, a pulsed light beam (a series of light pulses).

As used herein, the terms "scanning electron microscopy measurement data" and "SEM measurement data" are interchangeable.

As used herein, the term "SEM image", with reference to an inspected structure, is used to refer to an image obtained by sensing secondary electrons and/or backscattered electrons generated as result of scanning the inspected structure with an electron beam.

As used herein, the term "scanning electron microscope" (SEM) is used to refer to a setup including an electron beam source and one or more of an electron sensor (configured to sense secondary and/or backscattered electrons), an X-ray light sensor, a cathodoluminescent light sensor, and/or an absorbed current sensor.

As used herein, the term "via", in the context of semiconductor structures, may be used to refer to an elongated hole.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. No feature described in the context of an embodiment is to be considered an essential feature of that embodiment, unless explicitly specified as such.

Although operations of methods, according to some embodiments, may be described in a specific sequence, the methods of the disclosure may include some or all of the described operations carried out in a different order. In particular, it is to be understood that the order of operations and sub-operations of any of the described methods may be reordered unless the context clearly dictates otherwise, for example, when a latter operation requires as input an output of a former operation or when a latter operation requires a product of a former operation. A method of the disclosure may include a few of the operations described or all of the operations described. No particular operation in a disclosed method is to be considered an essential operation of that method, unless explicitly specified as such.

Although the disclosure is described in conjunction with specific embodiments thereof, it is evident that numerous alternatives, modifications, and variations that are apparent to those skilled in the art may exist. Accordingly, the disclosure embraces all such alternatives, modifications, and variations that fall within the scope of the appended claims. It is to be understood that the disclosure is not necessarily limited in its application to the details of construction and the arrangement of the components and/or methods set forth herein. Other embodiments may be practiced, and an embodiment may be carried out in various ways.

The phraseology and terminology employed herein are for descriptive purpose and should not be regarded as limiting. Citation or identification of any reference in this application shall not be construed as an admission that such reference is available as prior art to the disclosure. Section headings are used herein to ease understanding of the specification and should not be construed as necessarily limiting.

What is claimed is:

1. A computerized system for non-destructive hybrid acousto-optic and scanning electron microscopy based metrology, the system comprising a measurement setup and a computational module;
   wherein the measurement setup comprises an acousto-optic setup and a scanning electron microscope (SEM);
   wherein the acousto-optic setup comprises light generating equipment and a light detector and is configured to obtain acousto-optic measurement data of an inspected structure on a sample:
   wherein the SEM is configured to obtain scanning electron microscopy measurement data of the inspected structure; and
   wherein the computational module is configured to:
      process the obtained measurement data to extract values of key measurement parameters corresponding to the acousto-optic measurement data and the scanning electron microscopy measurement data, respectively; and
      obtain estimated values of one or more structural parameters of the inspected structure by executing an algorithm, which is configured to jointly process the extracted values to output estimated values of the one or more structural parameters.

2. The system of claim 1, wherein the algorithm is a machine-learning (ML) derived algorithm.

3. The system of claim 1, wherein the algorithm is a search algorithm comprising an interpolator, which is configured to output interpolated values of the key measurement parameters when guesstimates of structural parameters are input thereinto, the search algorithm being configured to, starting from initial guesstimates of the structural parameters, repeatedly modify the guesstimates, until interpolated values of the key measurement parameters, obtained from the guesstimates, match the extracted values of the key measurement parameters to a required precision; and
   wherein the interpolator is a ML-derived algorithm or model-based.

4. The system of claim 1, wherein the inspected structure is exposed;
   wherein the light generating equipment is configured to:
      project an optical pump beam on the inspected structure, which is configured to be absorbed by the sample, so as induce an acoustic disturbance within the inspected structure; and
      while the acoustic disturbance is ongoing, project an optical probe beam on the inspected structure; and
   wherein the light detector is configured to sense an optical beam returned from the inspected structure, thereby obtaining at least part of the acousto-optic measurement data.

5. The system of claim 4, wherein the acoustic disturbance is constituted by an acoustic pulse, which propagates within the inspected structure, and which is induced by heating of the sample caused by the absorbance of the pump beam, and wherein the probe beam is configured to be Brillouin scattered off the acoustic pulse.

6. The system of claim 5, wherein the inspected structure comprises a base positioned on, or forming part of, the sample;
   wherein the inspected structure comprises vias, which nominally vertically extend from a top surface of the inspected structure to the base or in a direction thereof;
   wherein the acousto-optic setup is configured to project the pump beam and the probe beam on the top surface of the inspected structure; and
   wherein the pump beam is configured to be absorbed by the base, so that the acoustic pulse travels from the base in a direction of the top surface of the inspected structure.

7. The system of claim 6, wherein the pump beam is pulsed, the probe beam is pulsed, and the pump pulses in the pump beam and the probe pulses in the probe beam are alternating; and wherein the light generating equipment is configured to controllably vary a time delay time of the probe pulses relative to the pump pulses, respectively, thereby allowing to Brillouin scatter each probe pulse off a respective acoustic pulse, generated by a respectively last projected of the pump pulses, at a controllable depth within the inspected structure.

8. The system of claim 7, wherein the acousto-optic setup is configured to project K≥2 pairs of the pump beam and the probe beam on the inspected structure, such that, for each 1≤k≤K, each probe pulse in the k-th probe beam is delayed by a time delay $\Delta t_k$ relative to a respectively last projected of the pump pulses in the k-th pump beam, thereby allowing to probe the inspected structure at each of K depths and obtain K corresponding acousto-optic measurement signals, respectively, which constitute at least part of the acousto-optic measurement data.

9. The system of claim 8, wherein the light generating equipment comprises a laser source, a beam splitter, and a variable delay line arranged such that a laser pulse, generated by the laser source, is split by the beam splitter into a first pulse portion, which constitutes, or is used in preparing, one of the pump pulses, and a second pulse portion, which is transmitted into the variable delay line, thereby generating one of the probe pulses; and wherein the variable delay line configured to controllably delay each probe pulse relative to a respectively last projected of the pump pulses.

10. The system of claim 9, wherein the system further comprises a lock-in amplifier and the light generating equipment further comprises an optical modulator;

wherein the optical modulator is configured to modulate a waveform of each of the first pulse portions, thereby preparing the respective pump pulses; and wherein each of the first pulse portions is modulated so as to be characterized by a carrier wave and an envelope, which is configured to facilitate extraction, through demodulation by the lock-in amplifier, of contributions of returned portions of the K pulsed probe beams to the K acousto-optic measurement signals, respectively.

11. The system of claim 6, wherein a wavelength of the probe beam is at least about two times greater than a diameter of the vias and/or a distance therebetween.

12. The system of claim 6, wherein the key measurement parameters, extracted from the scanning electron microscopy measurement data, comprise, for each of at least some of the vias, one or more of: (i) at least one first lateral geometrical feature characterizing an opening of the via, (ii) at least one second lateral geometrical feature characterizing a bottom surface of the via, and (iii) at least one third lateral geometrical feature quantifying a lateral distance between the opening and the bottom surface.

13. The system of claim 12, wherein the SEM comprises an electron sensor, and wherein the scanning electron microscopy measurement data comprise one or more SEM signals of the inspected structure, obtained by sensing with the electron sensor secondary and/or backscattered electrons generated as a result of scanning the inspected structure with an electron beam.

14. A method for non-destructive hybrid acousto-optic and scanning electron microscopy-based metrology, the method comprising:

obtaining acousto-optic and scanning electron microscopy measurement data of an inspected structure on a sample;

processing the measurement data to extract values of key measurement parameters corresponding to the acousto-optic measurement data and the scanning electron microscopy measurement data, respectively; and obtaining estimated values of one or more structural parameters of the inspected structure by inputting the extracted values into an algorithm, which is configured to jointly process the extracted values to output estimated values of the one or more structural parameters.

15. The method of claim 14, wherein the algorithm is a machine-learning (ML) derived algorithm.

16. The method of claim 14, wherein the algorithm is a search algorithm comprising an interpolator, which is configured to output interpolated values of the key measurement parameters when guesstimates of structural parameters are input thereinto, the search algorithm being configured to, starting from initial guesstimates of the structural parameters, repeatedly modify the guesstimates, until interpolated values of the key measurement parameters, obtained from the guesstimates, match the extracted values of the key measurement parameters to a required precision; and wherein the algorithm is a ML-derived algorithm or is model-based.

17. The method of claim 14, wherein the inspected structure is exposed;

wherein the acousto-optic measurement data is obtained by sub operations of:

projecting an optical pump beam on the inspected structure, which is configured to be absorbed by the sample, so as induce an acoustic disturbance within the inspected structure;

while the acoustic disturbance is ongoing, projecting an optical probe beam on the inspected structure; and measuring an optical beam returned from the inspected structure;

wherein the acoustic disturbance is constituted by an acoustic pulse, which propagates within the inspected structure, and which is induced by heating of the sample caused by the absorbance of the pump beam; and wherein the probe beam is Brillouin scattered off the acoustic pulse.

18. The method of claim 17, wherein the inspected structure comprises a base positioned on, or forming part of, the sample;

wherein the inspected structure comprises vias, which nominally vertically extend from a top surface of the inspected structure to the base or in a direction thereof;

wherein each of the pump beam and the probe beam are projected on the top surface of the inspected structure;

wherein the pump beam is configured to be absorbed by the base; and wherein the acoustic pulse travels from the base in a direction of the top surface of the inspected structure.

19. The method of claim 18, wherein the pump beam is pulsed laser beam, the probe beam is a pulsed laser, and the pump pulses in the pump beam and the probe pulses in the probe beam are alternating;

wherein the projection of the pump beam, the projection of the probe beam, and the measurement of the returned beam, are implemented K≥2 times;

wherein, for each 1≤k≤K, each probe pulse in the k-th probe beam is delayed by a time delay $\Delta t_k$ relative to a respectively last projected of the pump pulses in the k-th pump beam, such that each of the probe pulses is scattered off a respective acoustic pulse, induced by the respectively last projected pump pulse, at a probed depth $\Delta z_k$, corresponding to the time delay $\Delta t_k$, within the inspected structure; and wherein acousto-optic key measurement parameters specify a dependence of a frequency of Brillouin oscillations on the probed depth and/or a dependence of an amplitude of the Brillouin oscillations on the probed depth.

20. The method of claim 17, wherein the scanning electron microscopy measurement data comprise one or more SEM signals, obtained by sensing secondary and/or backscattered electrons generated as a result of scanning the inspected structure with an electron beam, and wherein the key measurement parameters, extracted from the scanning electron microscopy measurement data, comprise, for each of at least some of the vias, one or more of: (i) at least one first lateral geometrical feature characterizing an opening of the via, (ii) at least one second lateral geometrical feature characterizing a bottom surface of the via, and (iii) at least one third lateral geometrical feature quantifying a lateral distance between the opening and the bottom surface.

* * * * *